(12) United States Patent
Fukuda et al.

(10) Patent No.: US 7,242,013 B2
(45) Date of Patent: Jul. 10, 2007

(54) METHOD FOR DEPOSITING A FILM USING A CHARGED PARTICLE BEAM, METHOD FOR PERFORMING SELECTIVE ETCHING USING THE SAME, AND CHARGED PARTICLE BEAM EQUIPMENT THEREFOR

(75) Inventors: Muneyuki Fukuda, Kokubunji (JP); Hiroyasu Shichi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 447 days.

(21) Appl. No.: 10/873,170

(22) Filed: Jun. 23, 2004

(65) Prior Publication Data

US 2005/0066899 A1 Mar. 31, 2005

(30) Foreign Application Priority Data

Sep. 29, 2003 (JP) .............................. 2003-336691

(51) Int. Cl.
*H01J 37/305* (2006.01)

(52) U.S. Cl. ................................................. 250/492.2

(58) Field of Classification Search ............. 250/492.2, 250/492.21, 309, 492.1; 118/723 FI; 438/4, 438/619; 156/643.1; 427/552
See application file for complete search history.

(56) References Cited

U.S. PATENT DOCUMENTS 6,268,608 B1 * 7/2001 Chandler ................. 250/492.2

FOREIGN PATENT DOCUMENTS

| JP | 3-289133 | 4/1990 |
| JP | 8-298243 | 4/1995 |
| JP | 9-120153 | 9/1996 |
| JP | 2000-29201 | 7/1998 |

* cited by examiner

*Primary Examiner*—Kiet T. Nguyen
(74) *Attorney, Agent, or Firm*—Reed Smith LLP; Stanley P. Fisher, Esq.; Juan Carlos A. Marquez, Esq.

(57) ABSTRACT

Certain film deposition and selective etching technology may involve scanning of a charged particle beam along with a deposition gas and etching gas, respectively. In conventional methods, unfortunately, the deposition rate or the selective ratio is oftentimes decreased depending on optical system setting, scan spacing, dwell time, loop time, substrate, etc. Accordingly, an apparatus is provided for finding an optical system setting, a dwell time, and a scan spacing. These parameters are found to realize the optimal scanning method of the charged particle beam from the loop time dependence of the deposition rate or etching rate. This deposition rate or etching rate are measurements stored in advance for a desired irradiation region where film deposition or selective etching should be performed. The apparatus displays a result of its judgment on a display device.

9 Claims, 23 Drawing Sheets

METHOD FOR DEPOSITING A FILM USING A CHARGED PARTICLE BEAM, METHOD FOR PERFORMING SELECTIVE ETCHING USING THE SAME, AND CHARGED PARTICLE BEAM EQUIPMENT THEREFOR

CLAIM OF PRIORITY

The present invention claims priority from Japanese application JP 2003-336691 filed on Sep. 29, 2003, the content of which is hereby incorporated by reference in its entirety.

BACKGROUND OF THE INVENTION

1. Field of the Invention

This invention relates to a method for depositing a film by using a deposition gas, a method of selective etching by using an etching gas, charged particle beam equipment for these methods, a method for manufacturing a large scale integration (LSI), and a technology of LSI manufacturing equipment. More particularly, the present invention relates to technology that is effective when being applied to a method for depositing a film by using a deposition gas and a focused ion beam (FIB) or a method for performing selective etching by using an etching gas and a FIB.

2. Discussion of Background

A conventional FIB apparatus can scan the surface of a sample with the FIB, detect secondary electrons and secondary ions generated from the sample surface, and observe a minute region of the sample surface from their profiles. Moreover, the FIB apparatus can perform sputter etching on the sample surface by scanning the sample surface with the FIB. Furthermore, by introducing a gas used for making a thin film into a sample chamber, spraying it on the sample surface, and simultaneously scanning the sample surface with the FIB, the apparatus can decompose this raw material gas and form a metal film, among other things, by deposition on the sample surface in an FIB scanning region. This film deposition method is called the FIB assisted deposition (FIBAD) method. In addition, when performing sputter etching, if an etching gas is sprayed on the substrate, the etching rate for each substrate constituent material can be increased or decreased as desired. This etching method is called the selective etching method. The FIBAD method and the selective etching method are widely used.

FIG. 1 is a view showing FIB scanning and a method for introducing a gas used in the FIBAD method and in the selective etching method. A gas is introduced to a substrate 21 locally from a nozzle 12. By bringing the nozzle 12 close to an FIB irradiation position, the quantity of gas adsorbed by the substrate 8 can be increased. In the FIBAD method and in the selective etching method, a gas used as a raw material (deposition gas or etching gas) is sprayed from the nozzle 12, and the FIB is scanned in a desired scanning region 18.

FIG. 2 shows a method for scanning FIB 11. The FIB 11 has a limited probe size 14 on the surface of the substrate 8. The deposition gas 15 introduced from the nozzle 12 is adsorbed on the surface of the substrate 8. The FIB 11 stays at a scan lattice point 16 for a constant time, and then moves to the adjacent scan lattice point 16 away from the scan lattice point 16 by the distance of a scan spacing 17. Generally, the scan spacing 17 is set in conformity to the probe size 14 of the FIB, that is, to 10 nm to 1000 nm. Repeated scanning of the scanning region 18 by the above-mentioned technique makes the irradiation density of the FIB uniform, and simultaneously realizes uniformity of the film thickness that is formed by deposition in the FIBAD method or uniformity of etching depth in the selective etching method.

As a technology of equalizing the thickness of a film formed by the FIBAD method, there are the following prior arts. A first example (JP-A No. 298243/1996) discloses a FIBAD method for effectively equalizing the whole quantity of FIB irradiation on the sample surface in the case where there is inclination or holes on the whole surface of a sample on which a film is intended to be accumulated by changing the quantity of FIB irradiation according to an effective area irradiated with the FIB. A second example (JP-A No. 289133/1991) discloses a technology of equalizing the thickness of a film that is accumulated by controlling scanning conditions of a beam (beam scanning speed, scanning pitch, and scanning pattern) according to beam conditions of the FIB (acceleration voltage and beam current).

Further, as a technology of equalizing the etching rate in the case where selective etching is performed using the FIB, there are the following prior arts. A third example (JP-A No. 120153/1997) discloses a technology of moving the FIB irradiation spot to the outside of the scanning region and halting the FIB irradiation for a predetermined time until sufficient etching gas is supplied to the adjacent irradiation spot when the FIB irradiation spot is moved to the adjacent irradiation spot. During this period, the FIB is blanked, and hence is not allowed to irradiate a moved position of the beam spot. Because of this, the etching rates in the irradiation spot and in a superposed position are equalized. A fourth example (JP-A No. 29201/2000) discloses a technology in which the etching rate have been obtained in advance for different kinds of processing parts (area, position, and shape) and the number of shots of FIB irradiation is decided according to a processing part.

SUMMARY OF THE INVENTION

It has been recognized that what is needed is ***. Broadly speaking, the present invention fills these needs by providing ***. It should be appreciated that the present invention can be implemented in numerous ways, including as a process, an apparatus, a system, a device or a method. Several inventive embodiments of the present invention are described below.

When film deposition or selective etching is performed using the conventional FIB apparatus, an operator sets a region in which the FIB is scanned and then selects an optimal beam current and a scanning method by experience. Moreover, generally the feed rate of a raw material gas and the scanning speed of the FIB at the time of processing are fixed. Unfortunately, if the setup by the operator is improper, a film is not formed on the substrate surface at the time of film deposition, and the etching rate difference on the substrate surface within the irradiation region of the FIB is small at the time of selective etching. The technology disclosed by the first example above is a technology of varying the quantity of FIB irradiation according to an irradiation position. However, mere change in the quantity of FIB irradiation cannot lead to equalization of the deposited film, and consequently the technology is not able to cope with the deposition rate and the formation of a uniform film simultaneously. The second example discloses a technology of automatically setting the beam scanning speed, the scanning pitch, and the scanning pattern according to beam conditions. However, it does not indicate at all how the optical system setting should be optimized for a desired scanning region. The technology disclosed by the third example makes it possible to perform selective etching with a large selection ratio. However, since movement of the beam spot is delayed until an etching gas is supplied, the processing time is increased after all. The fourth example discloses a technology of deciding the number of shots of FIB irradiation according to a processing part considering an etching rate that was found in advance. However, mere change in the quantity of FIB irradiation according to area, position, and shape is insufficient to improve the processing speed. This is because if the processing conditions are intended to be optimized, not only the quantity of FIB irradiation but also the beam conditions of the FIB need to be altered according to a processing part, and the alteration of the beam conditions varies the etching rate.

Accordingly, one object of the present invention is to provide charged particle equipment capable of forming a film in a desired scanning region more efficiently than the conventional method in the film depositing technology by the use of scanning of a focused charged particle beam, or charged particle equipment capable of selective etching in a desired scanning region more efficiently than the conventional method in the selective etching technology by the use of scanning of a focused charged particle beam.

The processing using the FIB (for example, film deposition, selective etching, etc.) requires an operation of optimizing a lot of parameters. Among processing parameters of the FIB, the film growth rate at the time of film deposition and the etching rate have optimal values for a loop time of the FIB. Here, the loop time means a time required for a charged particle beam to move from a scanning start position to a scanning end position and further return to the scanning start position in a desired region.

Conventionally, it has been considered that the film growth rate or etching rate only decreases monotonously with increasing loop time, and not considered at all that it might achieve a maximum or a local maximum. This concept is reasonable because enlarging the loop time means slowing the beam scanning speed, assuming that the area of the scanning region is set constant and the feed rate of a processing gas is set constant, and once the beam scanning speed becomes lower, naturally the processing speed in the whole processed area decreases.

This invention solves the above-mentioned problem by optimizing processing parameters of each FIB in light of the loop time dependence of the processing speed. By depositing a film according to the scanning method and an irradiation density both of which are based on the above-mentioned setup, a desired film can be formed at high speed, and at the same time the operator can alter the deposition setting in conformity to a desired film quality by reference to display of a judgment result. Consequently, this method can provide a technology of forming a film efficiently in the film-deposition technology by means of scanning of a charged particle beam.

The invention encompasses other embodiments of a method, an apparatus, and a system, which are configured as set forth above and with other features and alternatives.

BRIEF DESCRIPTION OF THE DRAWINGS

The present invention will be readily understood by the following detailed description in conjunction with the accompanying drawings. To facilitate this description, like reference numerals designate like structural elements.

DESCRIPTION OF THE PREFERRED EMBODIMENTS

An invention for ***** is disclosed. Numerous specific details are set forth in order to provide a thorough understanding of the present invention. It will be understood, however, to one skilled in the art, that the present invention may be practiced with other specific details.

First Embodiment

Figure 1:
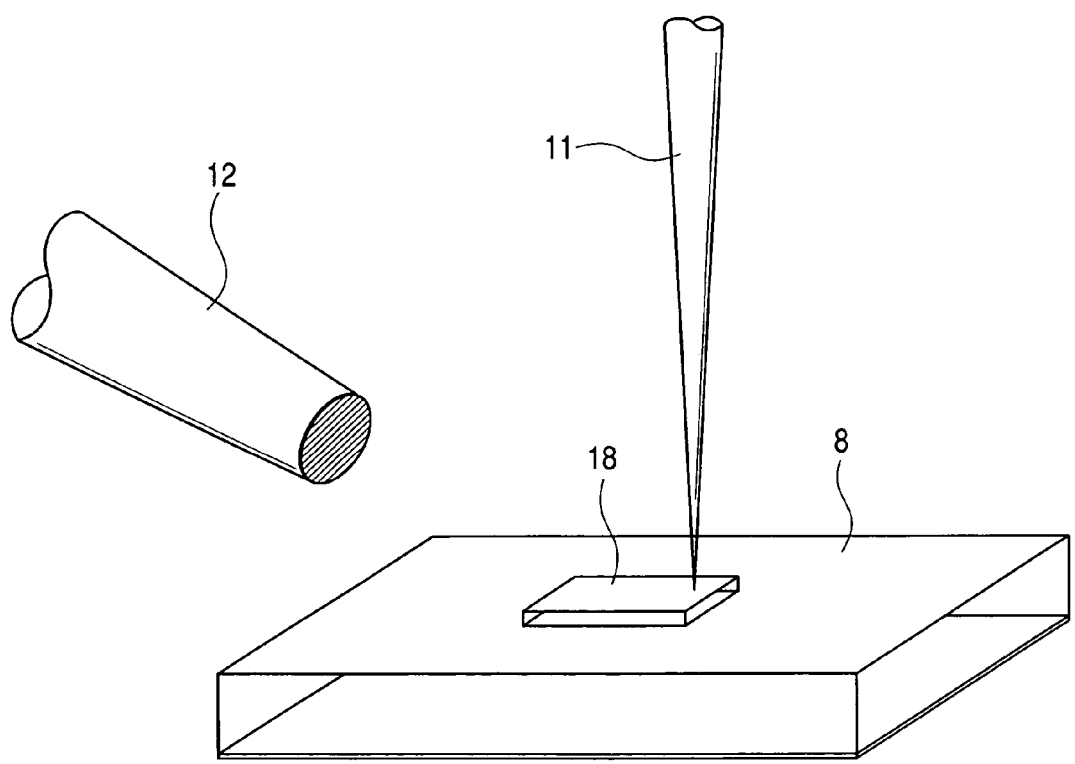
FIG. 1 is a view showing a conventional FIB scanning and a conventional method for introducing a gas.
Figure 2:
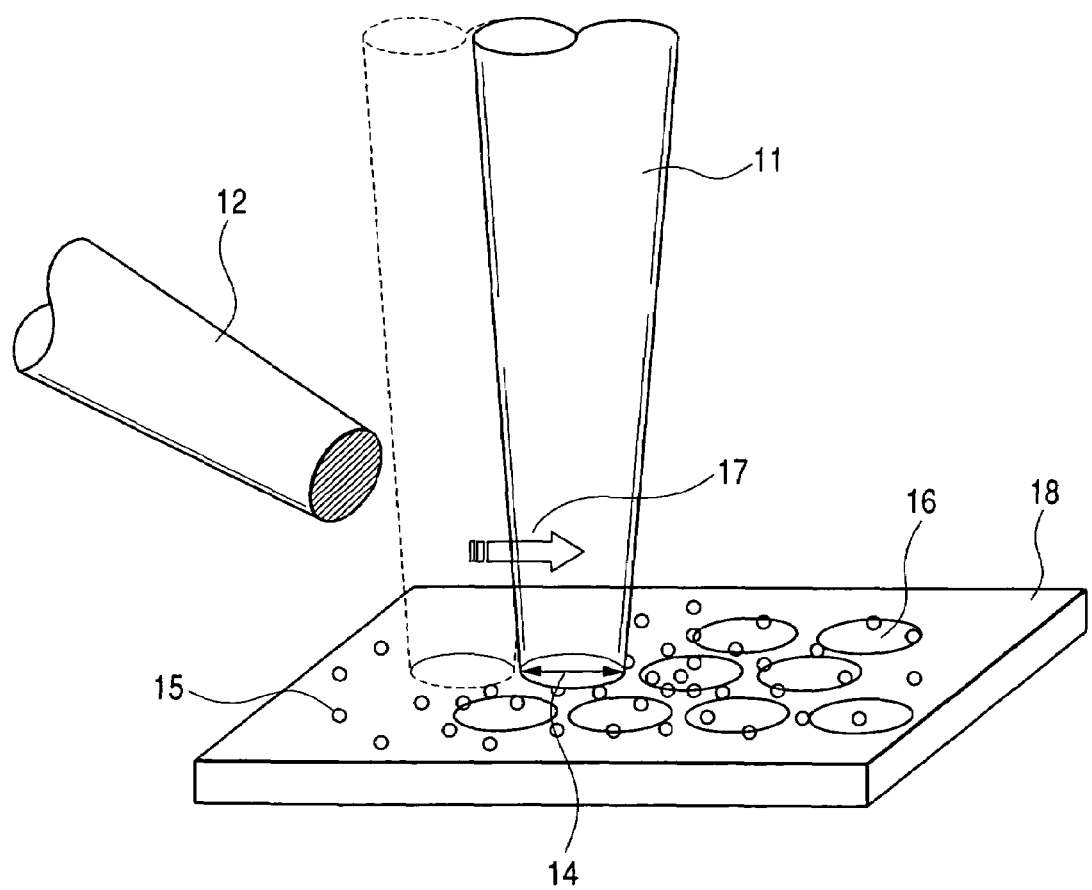
FIG. 2 is a view showing a conventional method for scanning the FIB in the conventional technology.
Figure 3:
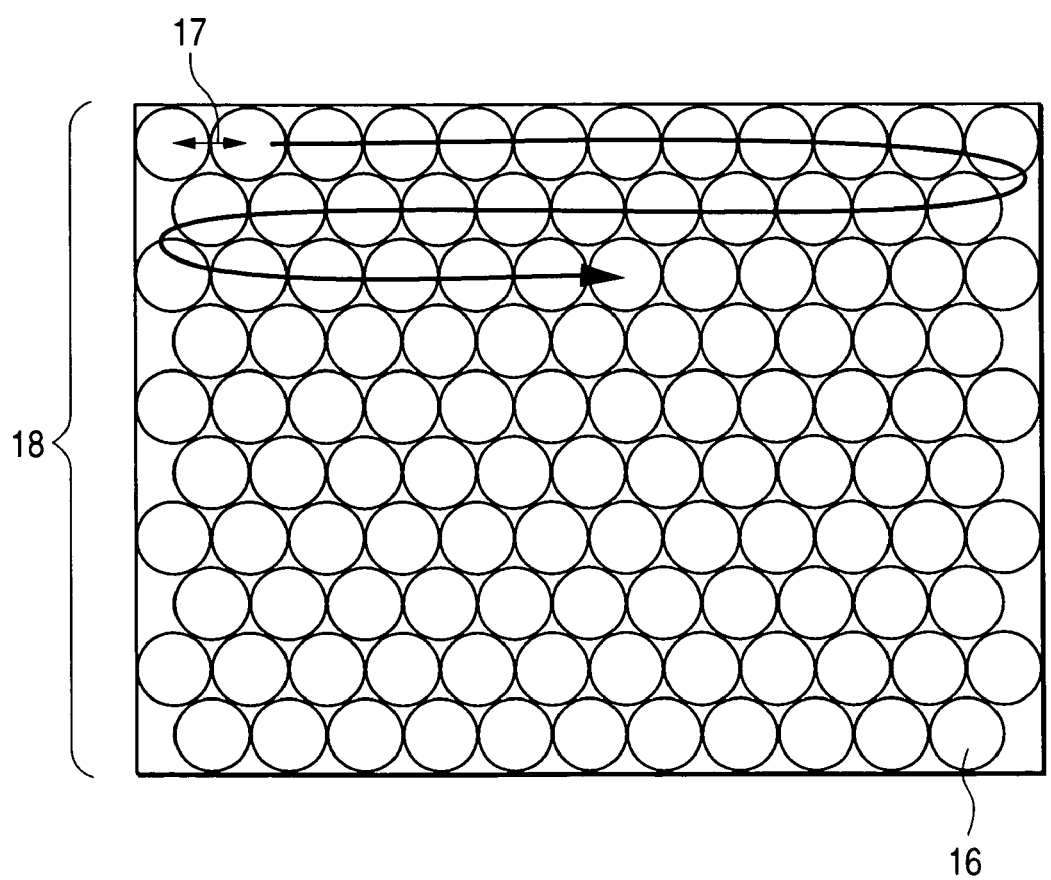
FIG. 3 is a view showing an example of arrangement of scan lattice points in the scanning region, in accordance with an embodiment of the present invention.

FIG. 3 shows schematically how a beam spot of a charged particle beam moves in the scanning region, in accordance with an embodiment of the present invention. One circle corresponds to one beam spot, and the beam spot is scanned along the direction of the arrow. Here, the "beam spot" means the size of an area in the sample surface that is occupied by the charged particle beam incident thereon. The center of the beam spot is called a "scan lattice point," and is designated by the numeral 16 in FIG. 3. The numeral 18 denotes a scanning region, and FIG. 3 shows an example in which the scan lattice points are arranged to form triangular lattices in the scanning region.

Figure 4:
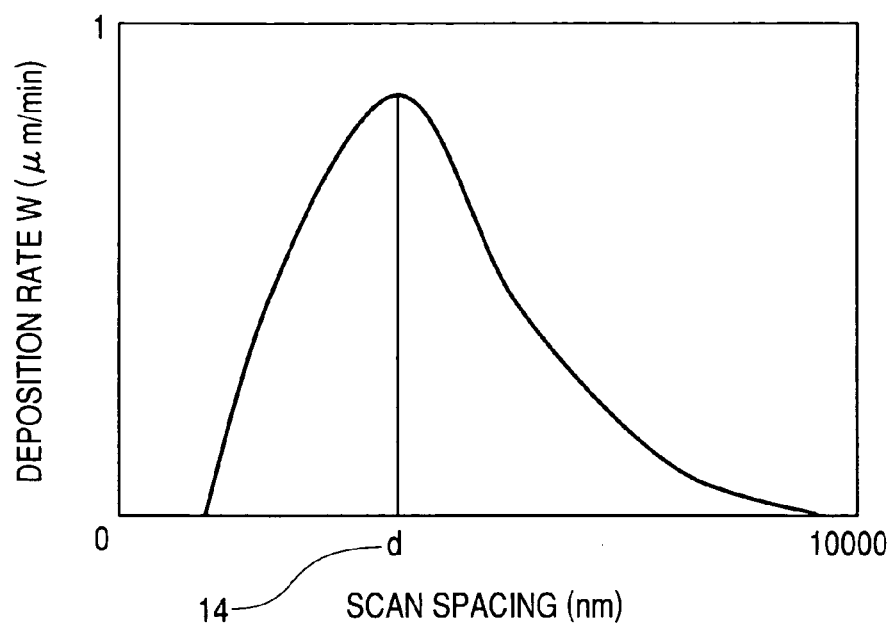
FIG. 4 is a diagram showing the scan spacing dependence of the deposition rate, in accordance with an embodiment of the present invention.

FIG. 4 shows the scan spacing dependence of the deposition rate, in accordance with an embodiment of the present invention. Here, the "scan spacing" means a distance between a certain scan lattice point and a scan lattice point most adjacent to the scan lattice point, and the "deposition rate" is the growth rate of a film thickness per unit time. The dwell time during which an incident charged particle beam stays at one beam spot and the loop time were fixed. The deposition rate increases with increasing scan spacing up to a distance of Point d, and after taking the maximum value at Point d, decreases with increasing scan spacing. The numeral 14 in the figure represents Point d. The size of Point d is equal to the magnitude of the probe size. In a range where the scan spacing is smaller than a distance of Point d, this signifies that the scan spacing is smaller than the beam spot size. In this range, when the beam moves to the adjacent spot, the beam in the adjacent spot overlaps the previous beam in the spot before moving in the said positions, where supplied deposition gas molecules are entirely consumed, and the deposition rate decreases.

Accordingly, as the scan spacing becomes smaller, an area defined by positions of superposition increases, and the deposition rate decreases. In a range where the scan spacing is larger than a distance of Point d, there develops a gap between adjacent beam spots. Since the beam is not made to irradiate the gap, an area where a film is not formed is produced in the scanning region, and consequently the deposition rate averaged in the whole scanning region decreases. For this reason, the deposition rate decreases with increasing scan spacing. A state where the scan spacing is equal to the probe size is identical to a state where the gap between adjacent beam spots is zero.

Figure 5:
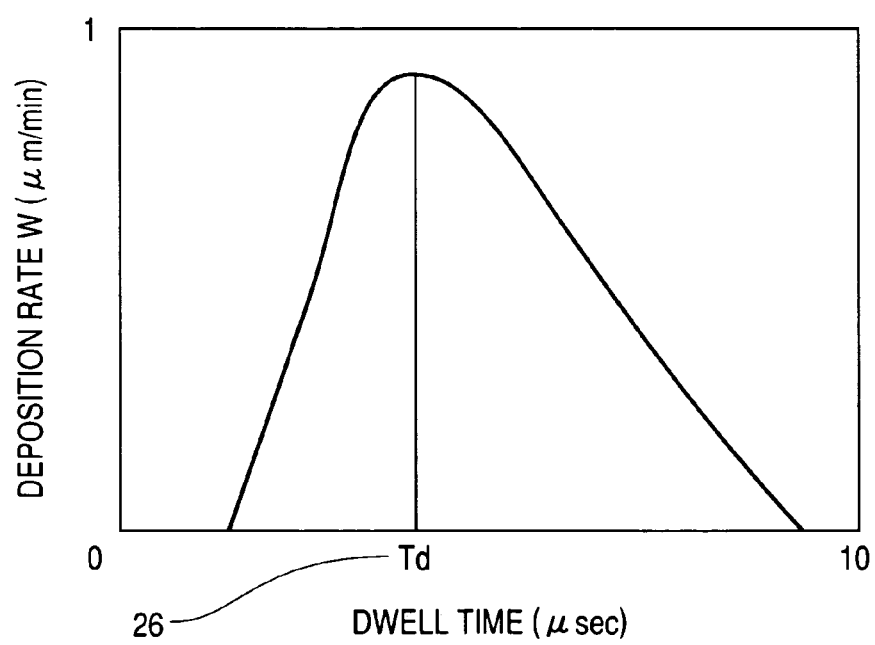
FIG. 5 is a diagram showing the dwell time dependence of the deposition rate, in accordance with an embodiment of the present invention.

FIG. 5 shows the dwell time dependence of the deposition rate, in accordance with an embodiment of the present invention. Here, the "dwell time" is a time during which the beam spot stays in a certain position. The scan spacing is adjusted to agree with the probe size so that a gap doses not develop between the adjacent beam spots. The loop time and the feed rate of the gas were fixed. The deposition rate increases with increasing dwell time, taking the maximum value at the optimal dwell time Td. When the dwell time passes the optimal dwell time, the deposition rate decreases with increasing dwell time. This signifies that when the feed rate of the processing gas to the processed region and the dwell time in the processed region take the optimal values, the processing speed becomes the maximum.

Figure 6:
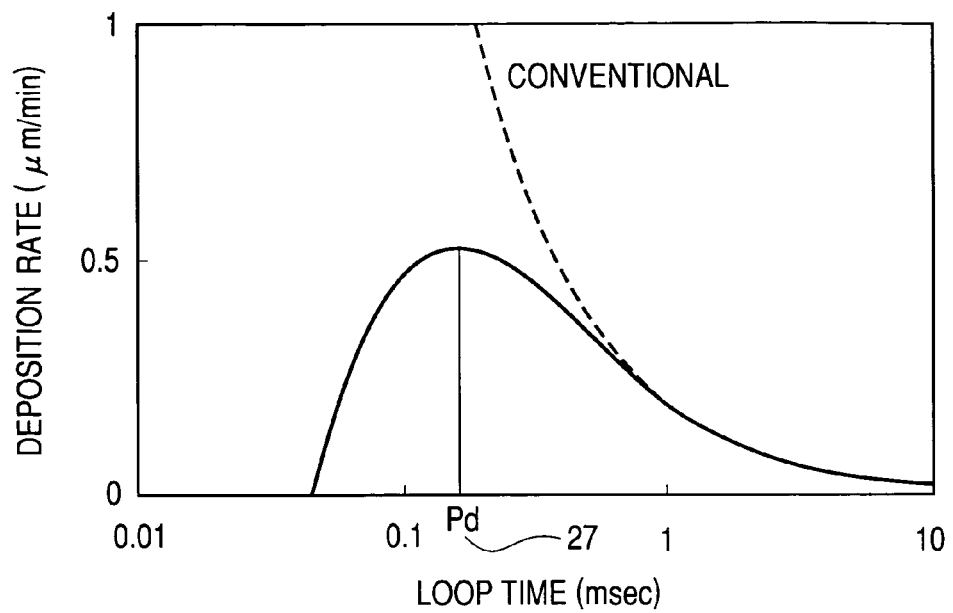
FIG. 6 is a diagram showing the loop time dependence of the deposition rate, in accordance with an embodiment of the present invention.

FIG. 6 shows the loop time dependence of the deposition rate. The dotted line is the loop time dependence of the deposition rate considered conventionally, and the solid line shows the loop time dependence of the deposition rate in this embodiment. The scan spacing was fitted to the probe size d, and the dwell time was fixed to the optimal dwell time Td. In the dotted line, the deposition rate reduces monotonously with increasing loop time, whereas in the solid line, the deposition rate takes the maximum value at loop time of Pd and decreases as the loop time leaves Pd.

FIG. 4, FIG. 5, and FIG. 6 show that the deposition rate becomes the maximum with the following setup: the scan spacing is set to the probe size d; the dwell time is set to the optimal dwell time Td; and further the size of the loop time is set to Pd. That is, in order to maximize the deposition rate, it is necessary to set the three parameters, scan spacing, dwell time, and loop time, to the optimal values. Both the probe size d that is the optimal value of the dwell time and the optimal dwell time Td that is the optimal value of the dwell time are strongly dependent on the optical system setting, especially on the beam current density of the charged particle beam. Note that the probe size d tends to increase in proportion to the beam current density. Therefore, the optimal dwell time is in inverse proportion to the beam current density. That is, designating the scanning area that maximizes the deposition rate for each optical system setting by S, S can be expressed roughly by the expression $S = Pd \times d^2 / Td$.

Next, by way of example, for a case where tungsten is used as a deposition material, how to obtain the relationship between the scanning area maximizing the deposition rate and each optical system setting will be illustrated.

Figure 7:
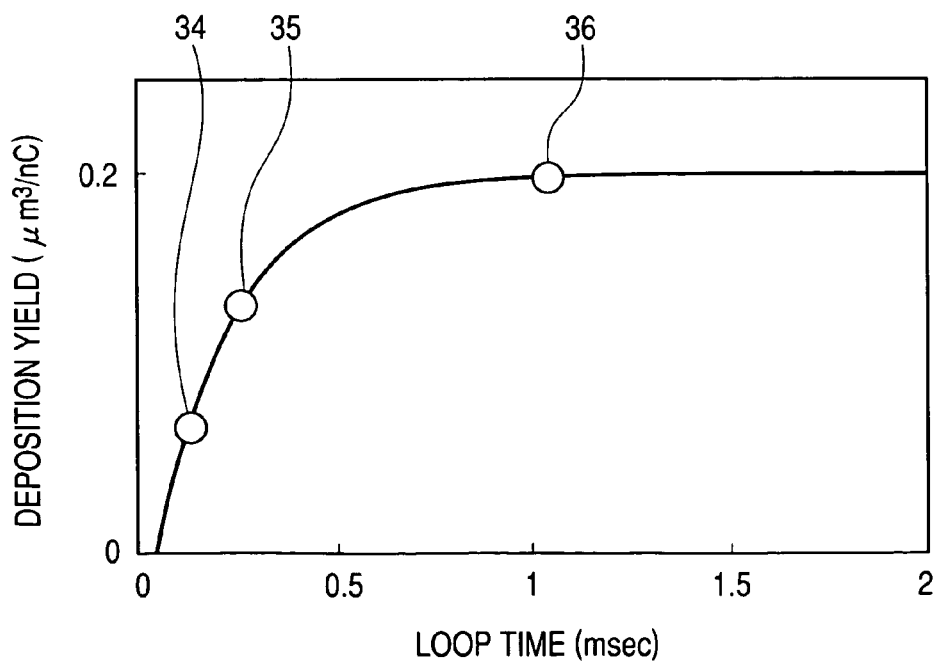
FIG. 7 is a diagram showing the loop time dependence of the deposition rate of tungsten deposition, in accordance with an embodiment of the present invention.

FIG. 7 shows the loop time dependence of the deposition yield for tungsten deposition, in accordance with an embodiment of the present invention. The deposition rate decreases for the loop time of 1 ms or less because it takes a time of about 1 ms for gas molecules to be adsorbed again on the substrate to become a sufficient quantity after being consumed by the FIB. On the other hand, the dwell time is a value of the order of μsec. It takes a time longer than the dwell time for the substrate to adsorb a sufficient amount of gas molecules.

The loop time dependence of the deposition rate shown in FIG. 7 can be fitted using the following empirical formulas for the deposition rate Y.

$$Y = Y_0 (1 - e^{-P/\tau}) - Y_{SP} \quad (1)$$

Here, $Y_0$ is a deposition coefficient; P is loop time 23; $\tau$ is a relaxation time; and $Y_{SP}$ is a sputter coefficient. Physically, the first term of Equation 1 represents the rate of the film thickness that is being formed and the second term $Y_{SP}$ represents the rate of the film thickness that is being etched by the sputtering. In order to find values of the parameters that fit Equation 1, all that is necessary is to find measured values of deposition rates for three points, Point A 34, Point B 35, and Point C 36, or so. The deposition rate W is obtained from Equation 1 as follows:

$$W = \frac{Y \cdot Ip \cdot Td}{P \cdot d^2} \quad (2)$$

Here, Ip is the beam current; Td is the optimal dwell time; P is the loop time; and d is the probe size. The maximum value of W for different loop time is obtained when the differential coefficient of W at P=Pd equals to zero, which is expressed by the following Equation 3:

$$\left. \frac{dW}{dP} \right|_{P=Pd} = 0 \quad (3)$$

Figure 8:
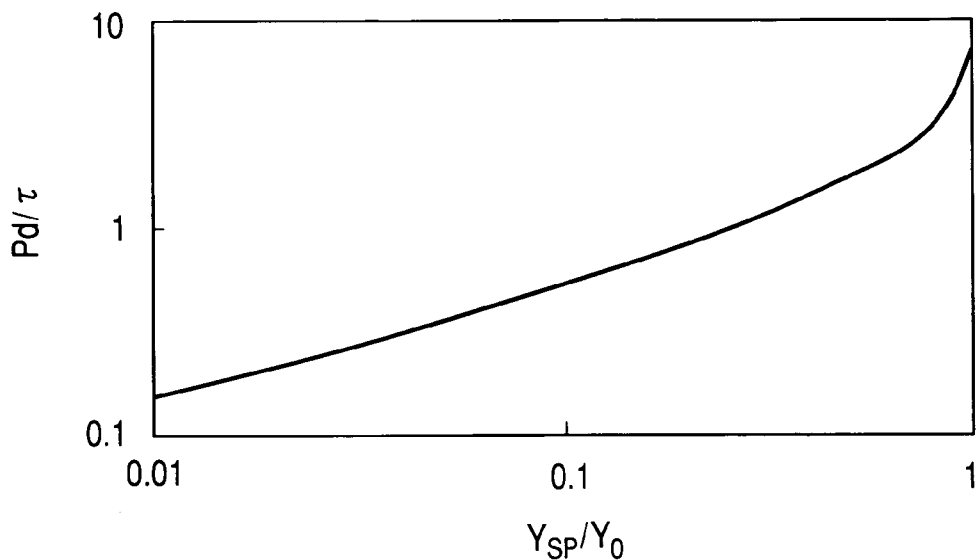
FIG. 8 is a diagram showing the YSP/Y0 dependence of the gas loop time Pd that produces the fastest deposition rate, in accordance with an embodiment of the present invention.

Here, Pd is the gas loop time. FIG. 8 shows the $Y_{SP}/Y_0$ dependence of the Pd/τ obtained from Equation 3. Pd, which is in inverse proportion to τ, increases with increasing $Y_{SP}/Y_0$. Thus, Pd can be decided from the loop time dependence of the deposition rate.

Figure 9:
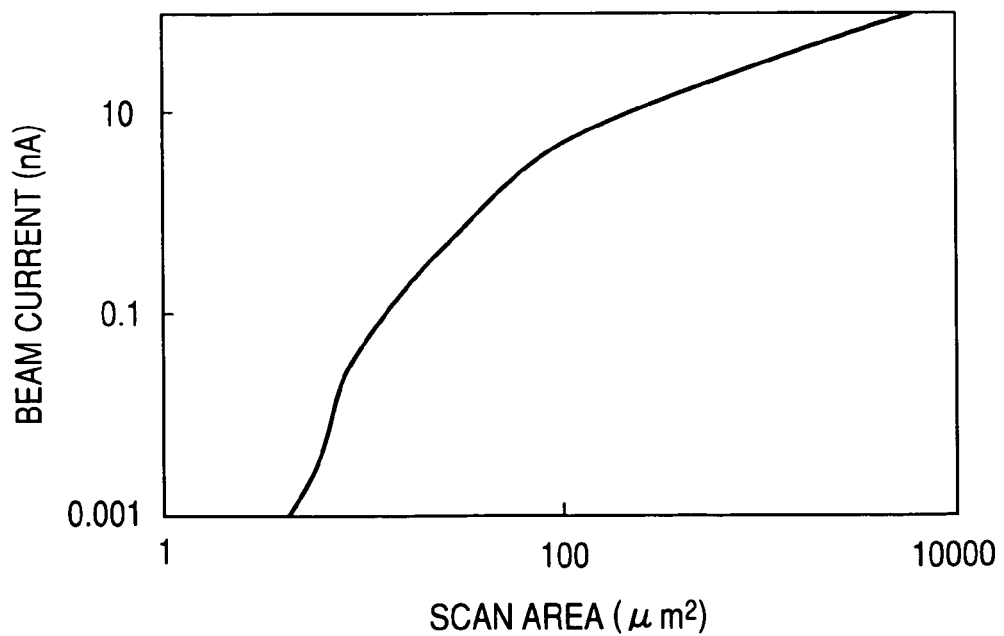
FIG. 9 is a diagram showing the beam current that produces the fastest deposition rate for the scanning area in a certain optical system, in accordance with an embodiment of the present invention.

FIG. 9 is a diagram showing the relationship between the beam current that produces the fastest deposition rate and the scanning area in the adopted optical system of the FIB equipment, in accordance with an embodiment of the present invention. The vertical axis represents the beam current, and the horizontal axis represents the scanning area at which the deposition rate becomes the maximum for each optical system setting. The scanning area in which the deposition rate becomes the maximum was obtained by an expression $S = Pd \times d^2 / Td$. The parameter Pd in the expression of S can be calculated by finding $Y_0$, τ, and $Y_{SP}$ from the fitting curve in FIG. 7 and substituting them into the solid line in FIG. 8. The parameter Td in the expression of S is the dwell time at which the solid line in FIG. 5 takes a peak value.

Moreover, the parameter d in the expression of S is a scan spacing at which the solid line in FIG. 4 takes a peak value. This scan spacing is in agreement with the probe size that varies depending on the beam current. Only after substituting the probe size of each beam current for the parameter d in the expression of S and comparing S, it becomes possible to decide the beam current that produces the fastest deposition rate for each scanning area.

The following discussion provides a summary of the method for deciding deposition parameters described above. The proposed method is a method for depositing a film on a sample substrate by spraying a deposition gas on the sample substrate and further scanning a charged particle beam that is focused by a charged-particle-beam irradiation optical system. The deposition rate is estimated from information of the loop time dependence of the deposition rate. The scanning is performed while holding the scan spacing and the dwell time of the charged particle beam constant.

In addition, the proposed method is this film deposition method, wherein film deposition is done by the following steps: storing the beam current, the probe size, and the optimal dwell time for each optical system setting; storing the loop time dependence of the deposition rate for each optical system setting in the form of a table or in the Equation 1; finding the deposition rate for an arbitrary scanning region by at least Equation 2; selecting an optical system setting that maximizes the deposition rate based at least on FIG. 9; and depositing a film using a scan spacing and an optimal dwell time that are obtained by the selected optical system setting and the probe size.

By incorporating the sequence described above into a sequencer of the deposition equipment or by incorporating it into a control unit of the deposition equipment as software, deposition equipment capable of processing with the deposition rate being set to the fastest to a targeted scanning area can be provided. The scanning area is inputted through a user interface of the deposition equipment. Note that this method is also applicable to selective etching using an etching gas, as with the film deposition using a deposition gas.

Figure 10:
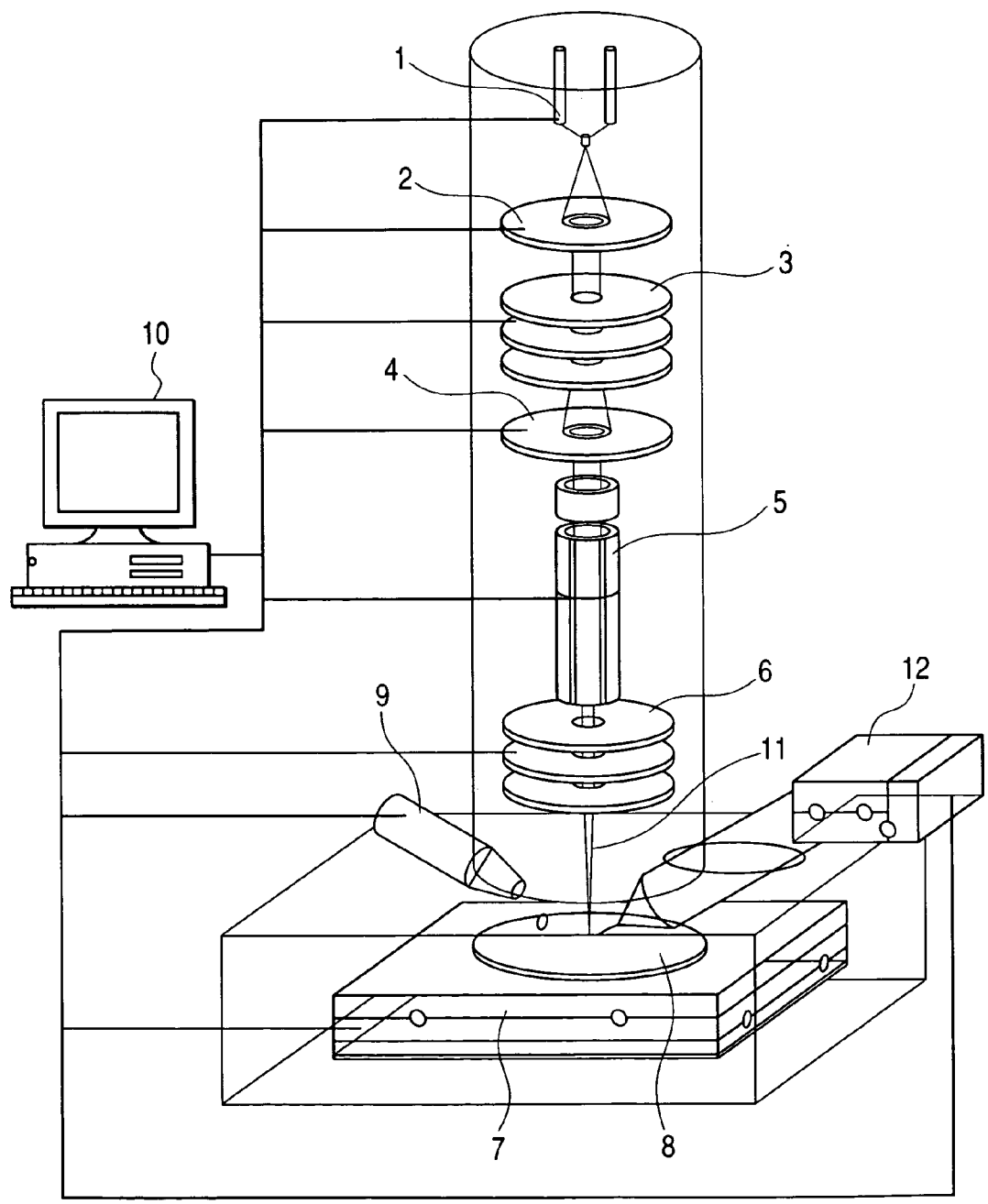
FIG. 10 is a schematic view showing the basic configuration of the charged particle beam equipment, in accordance with an embodiment of the present invention.

FIG. 10 shows a configuration example of the charged particle beam equipment that realizes the film deposition method described in this embodiment, in accordance with an embodiment of the present invention. The charged particle beam equipment in FIG. 10 comprises the following: a charged particle beam apparatus that extracts an ion beam from an ion source 1 by an extraction electrode 2, focuses the ion beam with a condenser lens 3, subsequently narrows the ion beam with a beam restraining aperture 4, and focuses the ion beam on the surface of a sample 8 with an objective lens 6; a movable sample stage 7 for mounting a sample; a secondary particle detector 9; a deflector 5; a control unit 10; a deposition gas nozzle 12.

Figure 11:
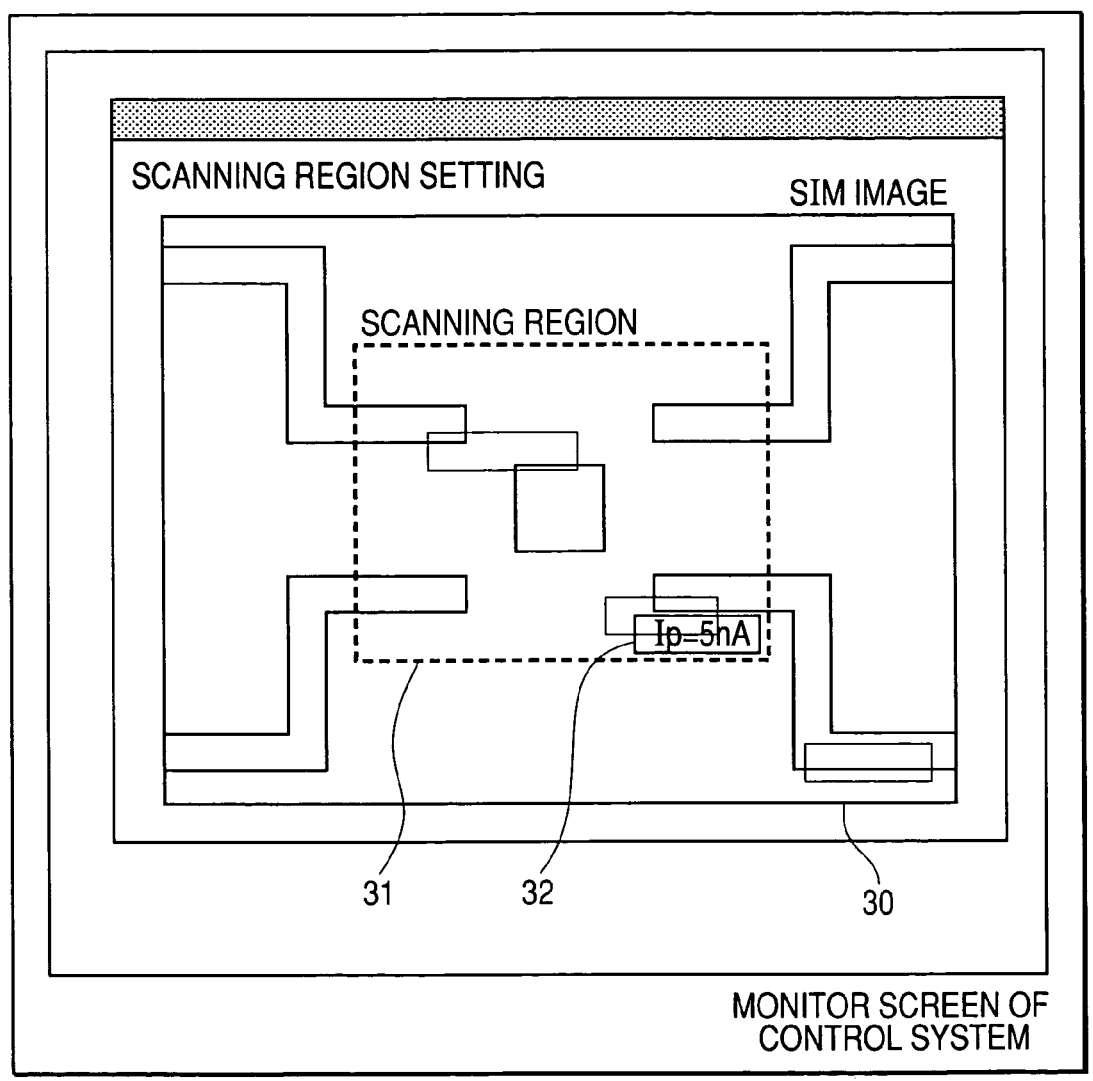
FIG. 11 is a view showing a scanning region setup screen, in accordance with an embodiment of the present invention.

FIG. 11 is a monitor screen of control system that serves as the user interface for controlling the deposition equipment shown in FIG. 10. In FIG. 11, a screen for setting up a scanning region is displayed on the monitor screen of control system. The operator sets the scanning region 31 in which a film is intended to be deposited, by referring to a scanning ion microscope image (SIM image) 30. The setup of the scanning region 31 is done through inputting means, such as a keyboard shown in the control unit 10 in FIG. 10. The control unit 10 of the deposition equipment locates the scanning area 19 from the preset value of the inputted scanning region 31, then finds the beam current 32 that produces the fastest deposition rate for the scanning area 19, and displays it on the monitor screen of control system. This scanning region setup screen displays the optimal values of the deposition parameters (beam current, dwell time, scan spacing, etc.) for the inputted scanning region 31.

Figure 12:
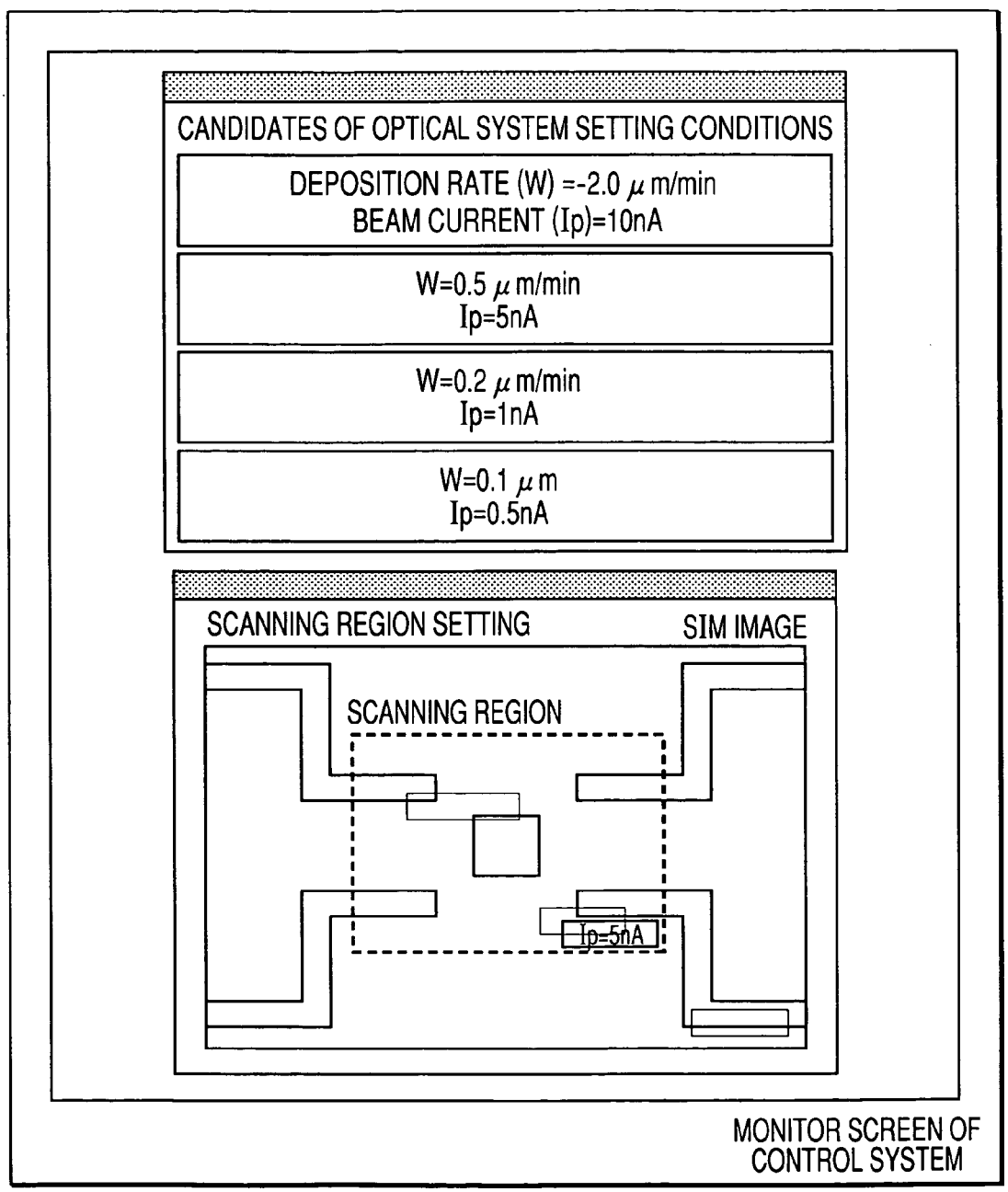
FIG. 12 is a view showing a selection screen for optical system setting, in accordance with an embodiment of the present invention.

FIG. 12 is an example of the control screen for optical system setting selection displayed on the monitor screen of control system. The control unit 10 of the deposition equipment finds the deposition rates for two or more beam current values responding to values of the scanning region being set through the user interface, and displays them on the selection screen for optical system setting. The deposition rate to be displayed may be calculated each time, or a value stored in the control unit or an external storage means may be read and displayed. The equipment operator selects the beam current value that produces a desired deposition rate through the user interface; the deposition equipment performs deposition under optimal conditions according to the inputted beam current value. The selection screen for optical system setting could display the deposition time instead of the deposition rate. Incidentally, it is also possible to set the beam mode as a choice other than the beam current value and display it on the selection screen for optical system setting.

Second Embodiment

In the first embodiment, the optimal values of the deposition parameters, Pd, Td, and d, were found by using the parameters decided from the fitting curves shown in FIGS. 7 through 9. The fitting curves shown in FIGS. 7 though 9 are curves that can be used for years fundamentally once they have been decided. However, there is a case where the fitting curve itself needs to be calibrated due to individual difference of equipment at the time of shipping, variation in deposition conditions, etc. Accordingly, in this embodiment, the fitting curves and a method for calibrating deposition parameters decided by the said curve will be described.

Figure 13:
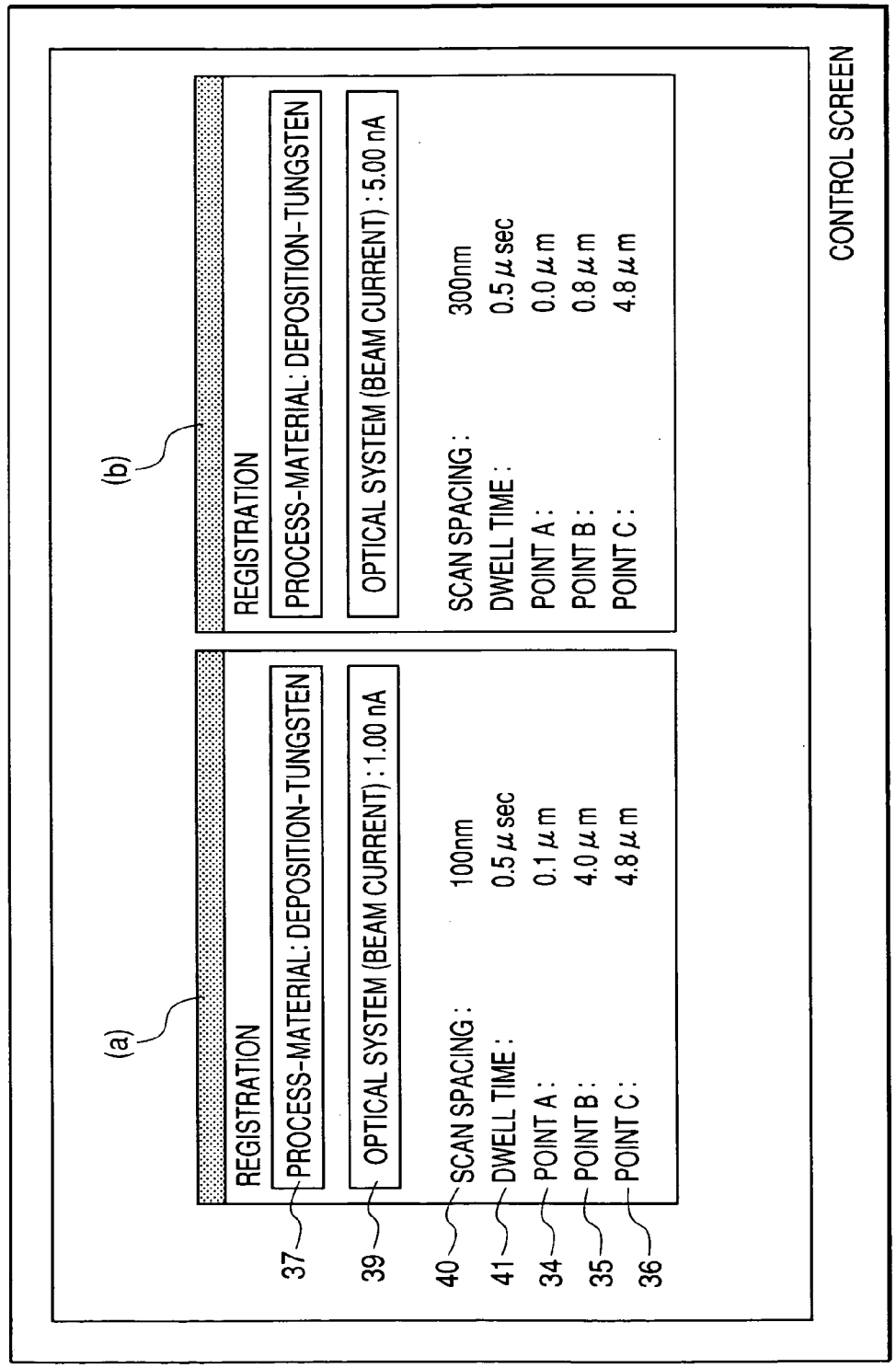
FIG. 13 is a view showing a deposition-rate calibration screen, in accordance with an embodiment of the present invention.

FIG. 13 shows the deposition-rate calibration screen that is displayed on a user interface screen of the control unit 10 included in the deposition equipment, in accordance with an embodiment of the present invention. The process and material 37 and the beam current 39 can be selected, individually. Here, the process means the kind of processing; in this embodiment, the process is selected from two kinds: film deposition (deposition), and selective etching. FIG. 13A shows a case with the following selections: the process is deposition; the deposition material is tungsten; and the beam current 39 is 1.00 nA. The probe size d is inputted as a scan spacing 40, the optimal dwell time 26 is inputted as a dwell time 41, and measured values of the film thickness obtained for different loop times are inputted as Point A 34, Point B 35, and Point C 36. According to the measured values of the film thickness being inputted, $Pd/\tau$, $Y_{SP}/Y_0$, etc., which are fitting parameters of the fitting curve, are calculated again and stored in the storing means in the control unit 10. The monitor screen of control system may be configured to show a plurality of calibration screens. FIG. 13B shows a calibration screen in the case where selected values of the optical system 39 are changed and fitting parameters are calibrated. Each time the selected values of the process and material 37 and the optical system setting 39 are changed, the probe size 14, the optimal dwell time 26, the film thicknesses measured for respective loop times are inputted as entries of the scan spacing 40, the dwell time 41, Point A 34, Point B 35, and Point C 36, respectively.

Figure 14:
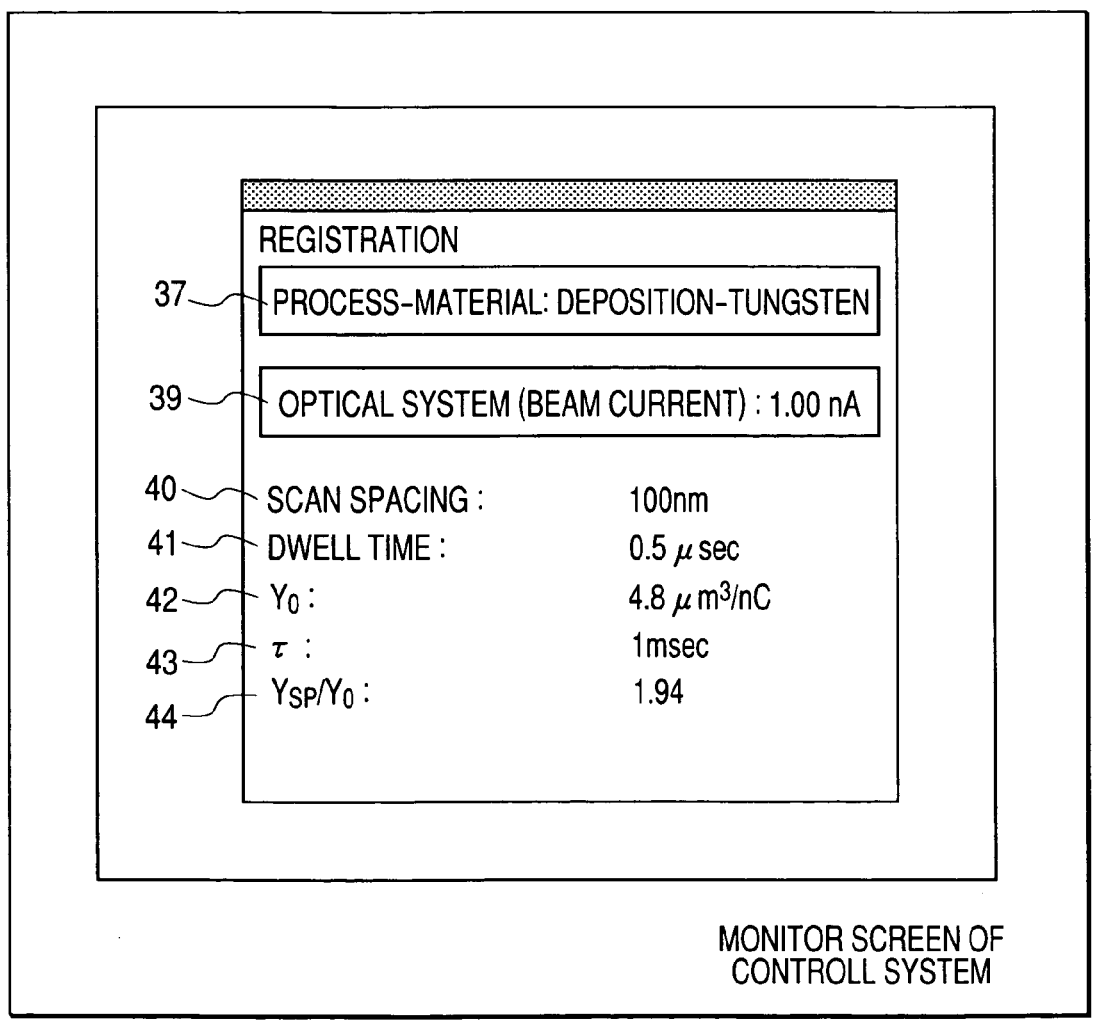
FIG. 14 is a view showing the screen on which the deposition rate is calibrated, in accordance with an embodiment of the present invention.

In FIG. 13, the calculation of the fitting parameters is done by the control unit of the deposition equipment, but the operator may input the fitting parameters directly. FIG. 14 shows the screen used for calibrating the deposition rate. For each process and material 37 and each preset value 39 of the optical system, the probe size d, the optimal dwell time Td, the deposition coefficient obtained from the loop time dependence of the deposition rate, the relaxation time, and the sputter coefficient are inputted as entries of the scan spacing 40, the dwell time 41, $Y_0$, $\tau$, $Y_{SP}$, respectively. The calibrated deposition rate is stored in the control unit 10 included in the deposition equipment, and is used to display the selection screen for optical system setting shown in FIG. 11 or FIG. 12.

Figure 15:
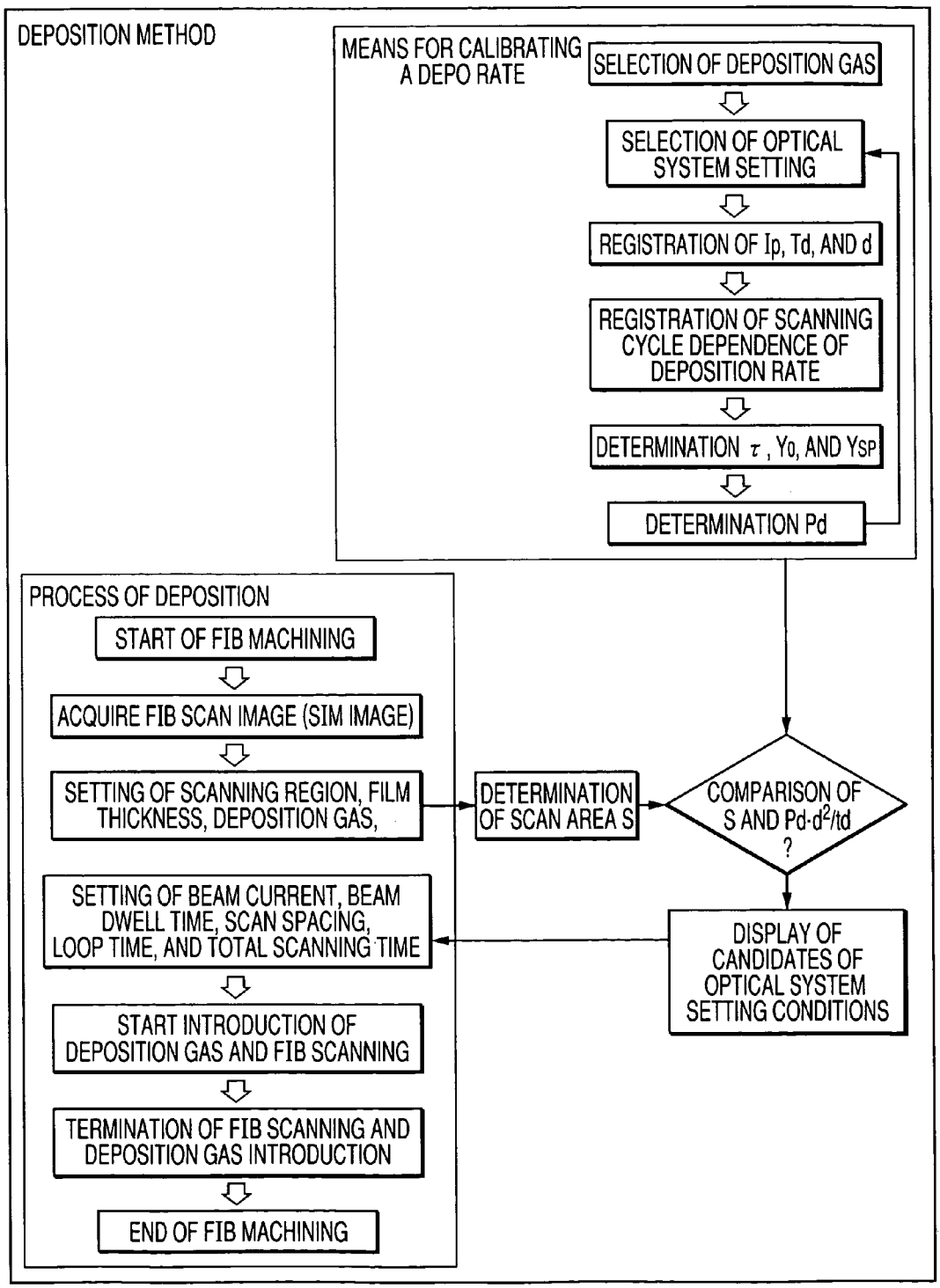
FIG. 15 is a flowchart showing the film deposition method, in accordance with an embodiment of the present invention.

FIG. 15 is a flowchart showing a method for depositing a film, in accordance with an embodiment of the present invention. By the calibrating means for calibrating the deposition rate shown in FIG. 13 or FIG. 14, the probe size d, the optimal dwell time Td, the deposition coefficient $Y_0$, the relaxation time $\tau$, the sputter coefficient $Y_{SP}$, and the optimal loop time Pd are set for two or more beam current values and are stored in the storing means in the control unit 10. In this occasion, a method in which the scanning area and the deposition rate are stored in the form of a table for each beam current value as substitutes for the deposition coefficient $Y_0$, the relaxation time $\tau$, the sputter coefficient $Y_{SP}$, the optimal loop time Pd, etc., may be used. In each optical system setting, the scanning area S that realizes the fastest deposition rate is expressed by Equation 4:

$$S = \frac{Pd \cdot d^2}{Td} \tag{4}$$

The control unit 10 selects an optical system setting that has a scanning area S close to the preset value of the scanning area being set through the user interface. Thereby, deposition parameters, such as beam current, dwell time, and scan spacing, are set automatically. Alternatively, since the probe size d affects the deposition rate, the following procedure may be adopted: auto-focusing is executed before film deposition; and the probe size d is set so that the beam is in focus on the surface of a sample that is at work. Furthermore, this method can also shorten the deposition time compared with the conventional method.

Figure 16:
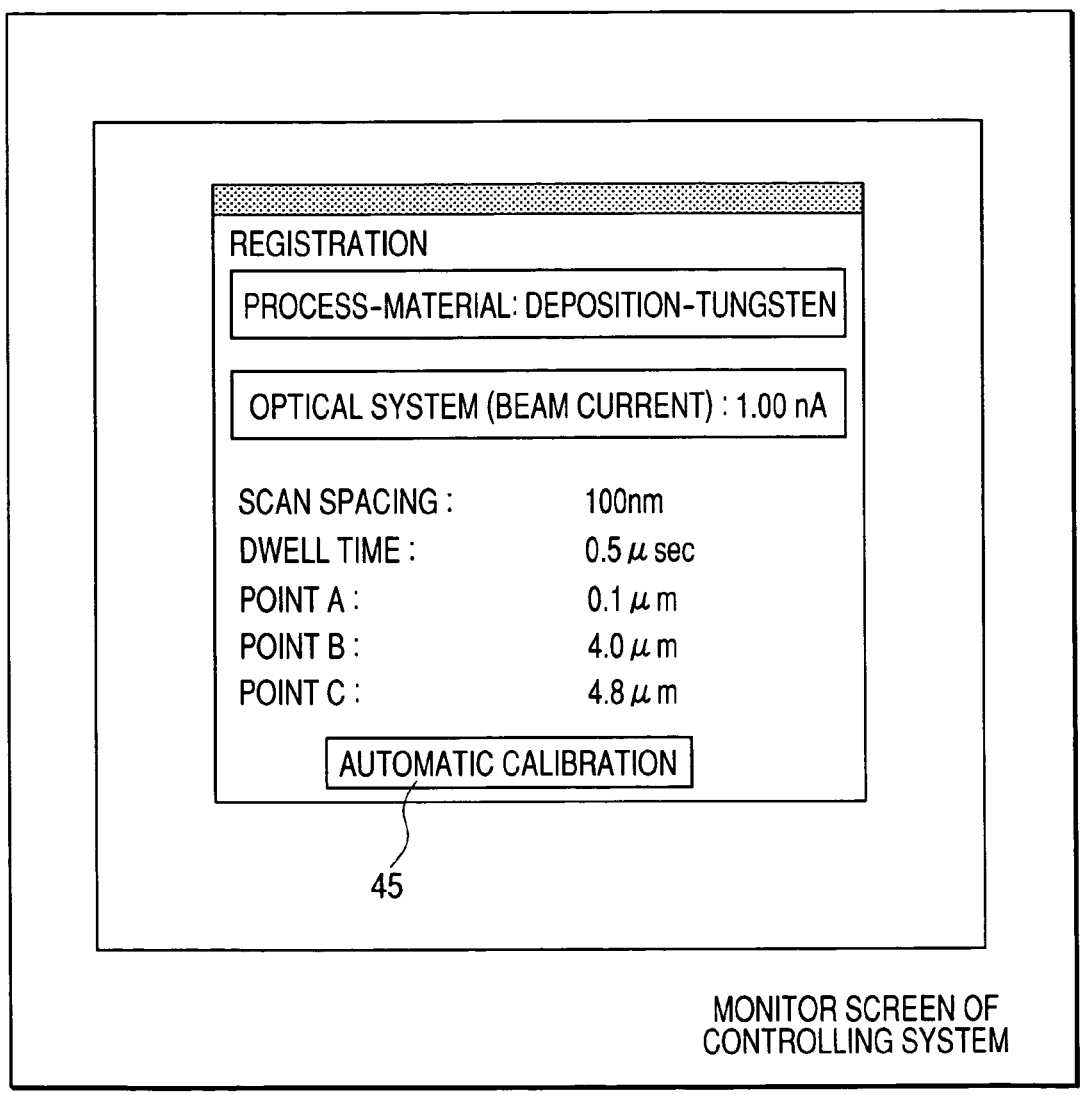
FIG. 16 is a view showing the deposition-rate calibration screen, in accordance with an embodiment of the present invention.

FIG. 16 shows the deposition-rate calibration screen, in accordance with an embodiment of the present invention. The means for calibrating the deposition rate described above is supplemented with an automatic calibration function 45 of estimating values of the deposition parameters at a different beam current value from preset values of the deposition parameters at a selected beam current value.

Figure 17:
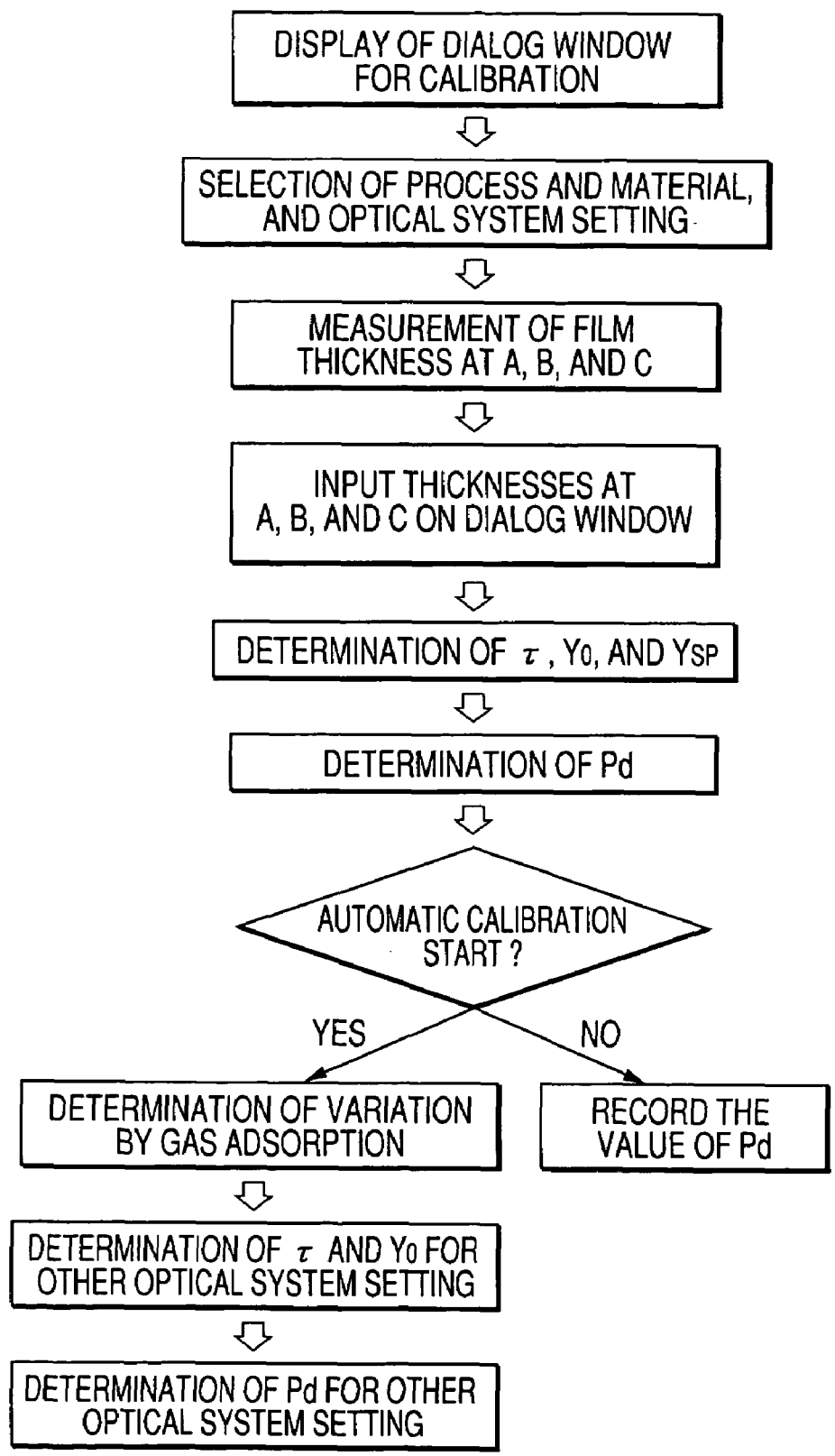
FIG. 17 is a flowchart of an automatic calibration function, in accordance with an embodiment of the present invention.

FIG. 17 is a flowchart in the case where the automatic calibration function is added, in accordance with an embodiment of the present invention. The relaxation time and the deposition coefficient are found using the measured value of the deposition rate for one optical system setting. The relaxation time and the deposition coefficient for another optical system setting are derived using their variations.

Third Embodiment

When a film is deposited by the FIB, there may be a case where a hollow is formed underneath a region where deposition is performed. This hollow is not a cavity in which nothing exists. Rather, the hollow formed is embedded with either a material whose material composition is the same as a film to be deposited or a reaction product of a material of the film to be deposited and a material forming the processed region. The reason for this embedded hollow is because the processed region is partly removed by a sputtering effect before the film is accumulated by the FIB and then the film is accumulated on it.

Figure 18:
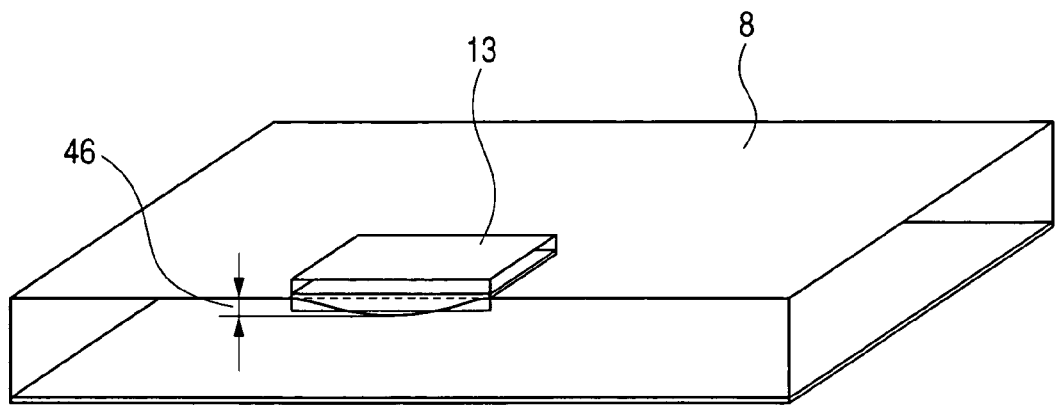
FIG. 18 is a diagram showing the cross section of a deposition film, in accordance with an embodiment of the present invention.

FIG. 18 shows how this process proceeds with a diagram showing the cross section of a deposition film, in accordance with an embodiment of the present invention. At a junction plane between the substrate 8 and the deposition film 13, a hollow is formed on the substrate surface by the FIB. When film deposition is done with Ga ions of 30 keV, the sputter depth between film and substrate 61 may become as much as 200 nm.

Figure 19:
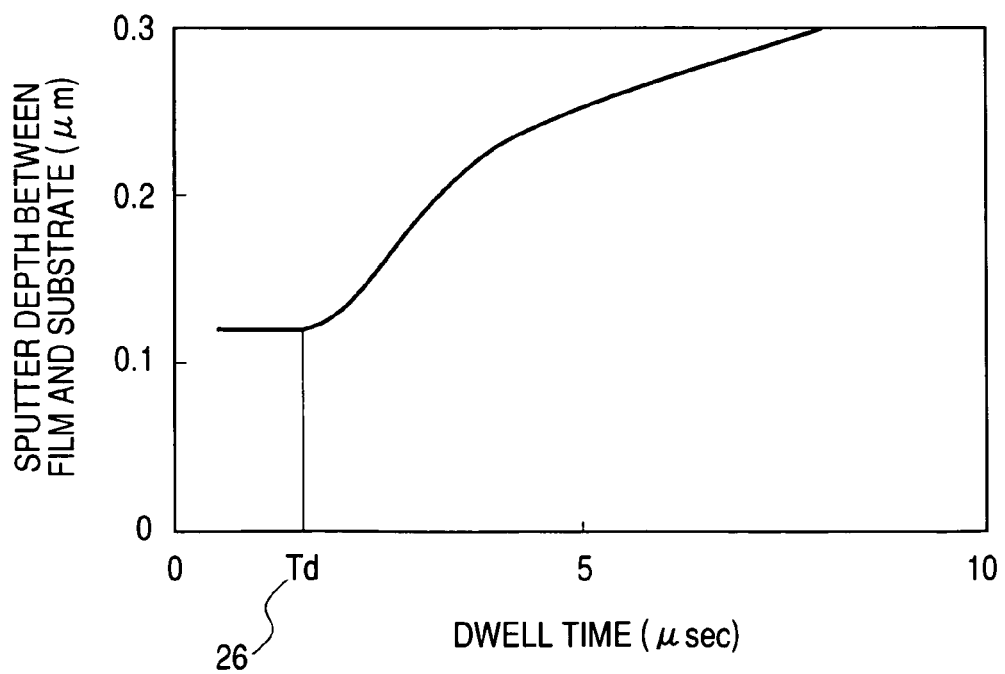
FIG. 19 is a diagram showing the dwell time dependence of the sputter depth between film and substrate, in accordance with an embodiment of the present invention.

FIG. 19 shows the dwell time dependence of the sputter depth between film and substrate, in accordance with an embodiment of the present invention. The sputter depth between film and substrate takes roughly a constant value for the dwell time ranging from 0 to the optimal dwell time Td, but increases for the dwell time exceeding Td. If the dwell time, among the deposition parameters, is set to the optimal dwell time Td and a film is deposited, the sputter depth between film and substrate can be made shallow as compared to a case of the film deposition that uses conventional technology.

Figure 20:
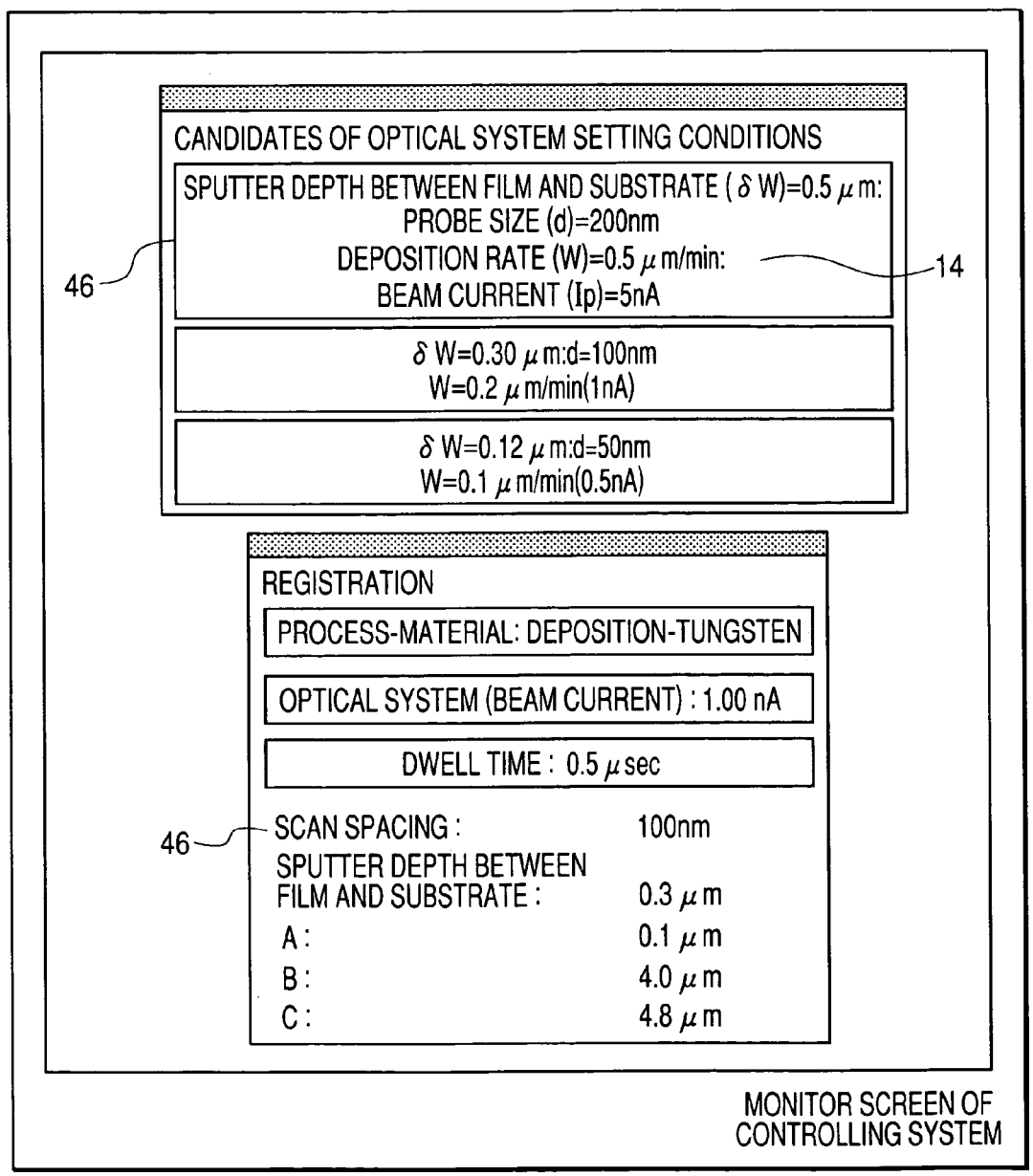
FIG. 20 is a view showing one set of film deposition monitor screen of control systems enabling selection of film quality, in accordance with an embodiment of the present invention.

FIG. 20 is one set of deposition monitor screen of controlling systems enabling selection of film quality, in accordance with an embodiment of the present invention. In the selection screen for optical system setting in FIG. 12, the sputter depth between film and substrate and the probe size are newly displayed. The operator can select a film quality from the sputter depth between film and substrate and the probe size. The registration screen is the registration screen in FIG. 13 with the sputter depth between film and substrate added.

Figure 21:
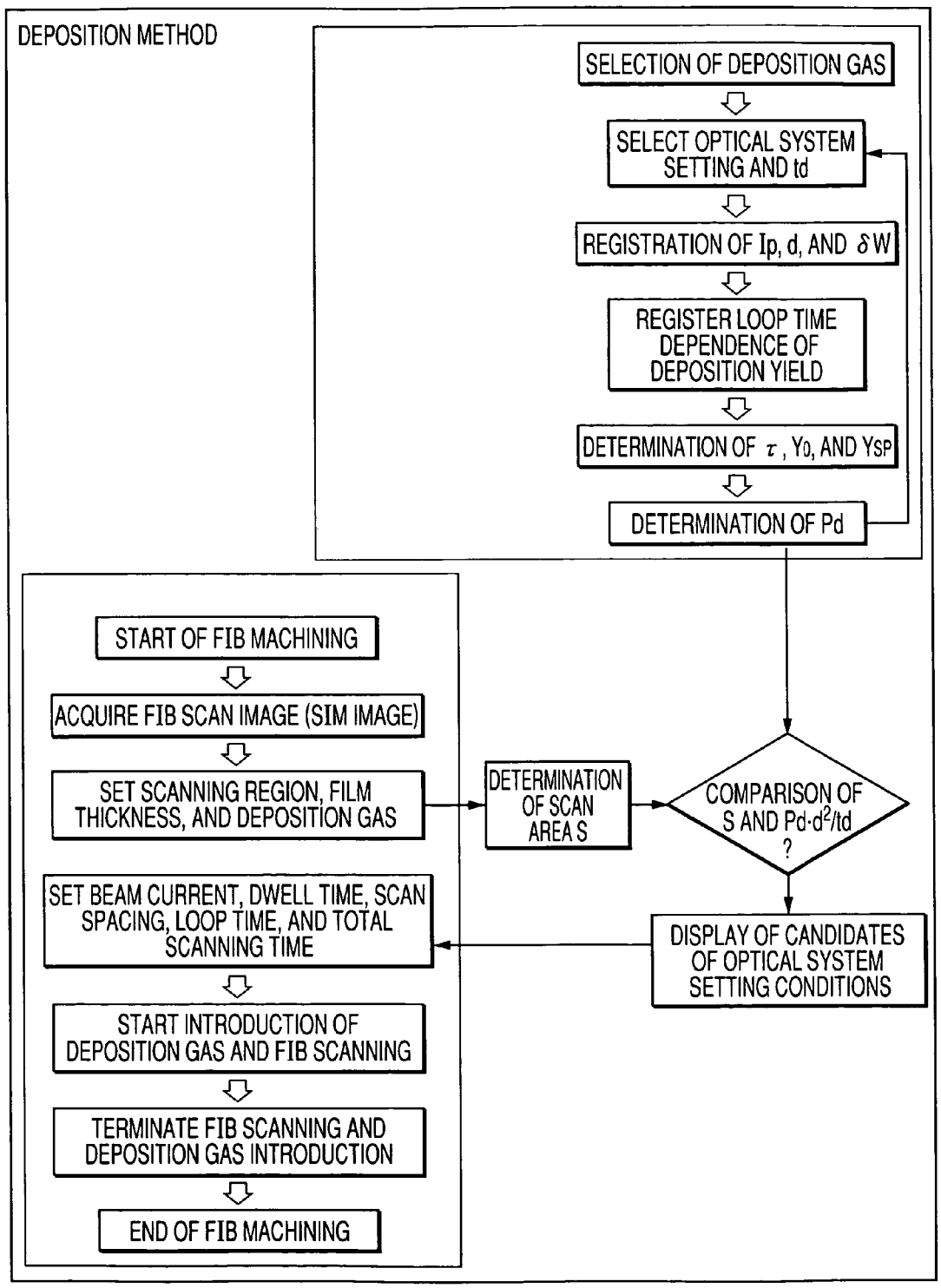
FIG. 21 is a flowchart of the film deposition method that makes possible selection of film quality, in accordance with an embodiment of the present invention.

FIG. 21 is a flowchart of the film deposition method that makes possible selection of film quality, in accordance with an embodiment of the present invention. The means for calibrating the deposition rate in FIG. 21 is the means for calibrating the deposition rate in FIG. 15 with the registration of the sputter depth between film and substrate ($\delta W$) 46 added. The optical system setting is altered from "Decide" to "Candidates of optical system setting are displayed" so that the operator can select it considering the film quality. The flowchart shown in FIG. 21 is incorporated in the control unit of the deposition equipment as software, and the control unit makes the deposition apparatus operate according to the steps shown in the flowchart.

Fourth Embodiment

Figure 22:
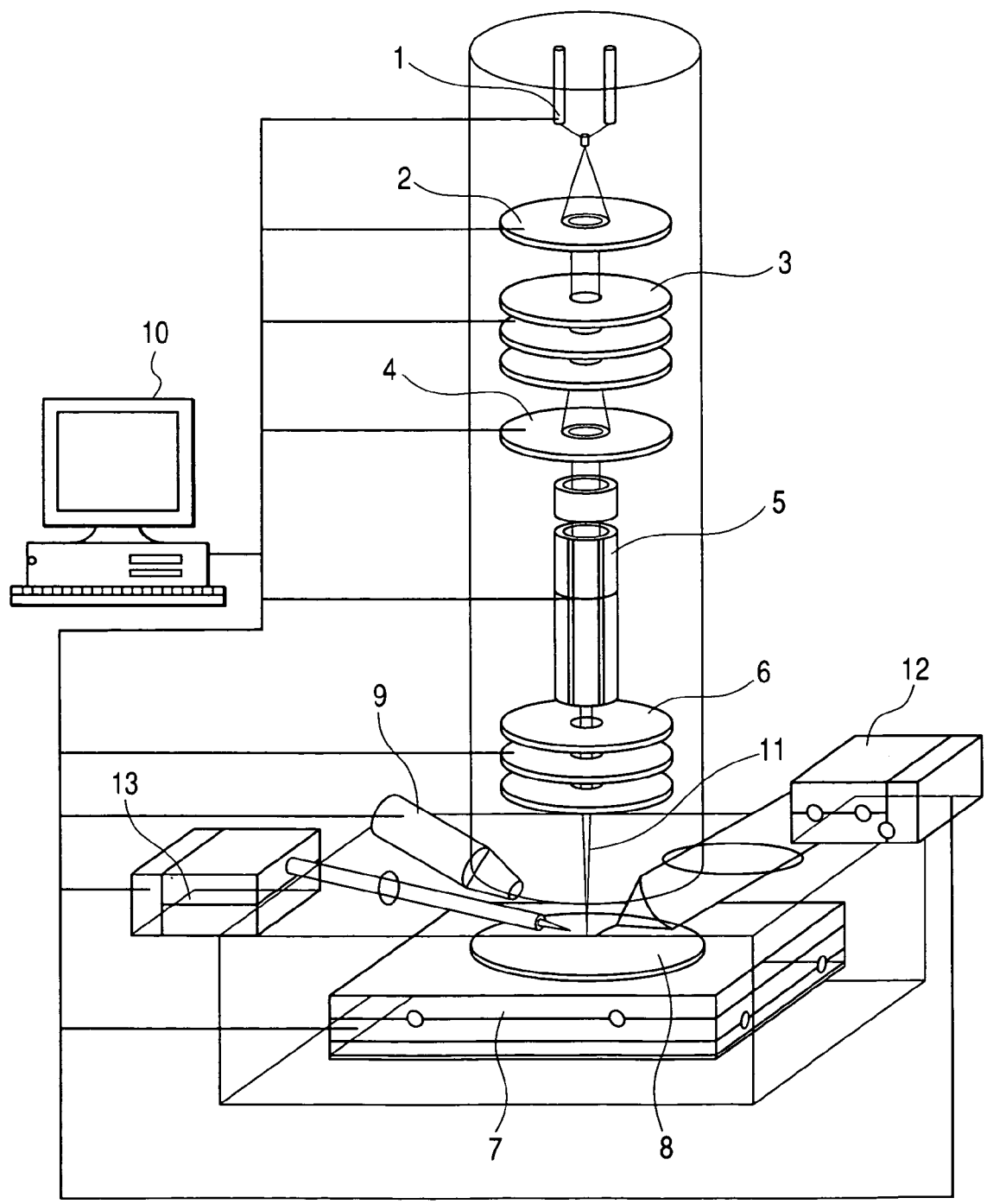
FIG. 22 is a configuration example of the charged particle beam equipment, in accordance with an embodiment of the present invention.

FIG. 22 is a configuration example of the charged particle beam equipment, in accordance with an embodiment of the present invention. The charged particle beam equipment in FIG. 22 comprises: a charged particle beam apparatus that extracts an ion beam from an ion source 1 by an extraction electrode 2, focuses the ion beam 11 with the condenser lens 3, subsequently narrows the ion beam with the beam restraining aperture 4, and focuses the ion beam 11 on the surface of the sample 8 with the objective lens 6; movable sample stage 7 for mounting a sample; the secondary particle detector 9; the deflector 5; the control unit 10; the deposition gas nozzle 12; and a mechanical probe 13.

Figure 23:
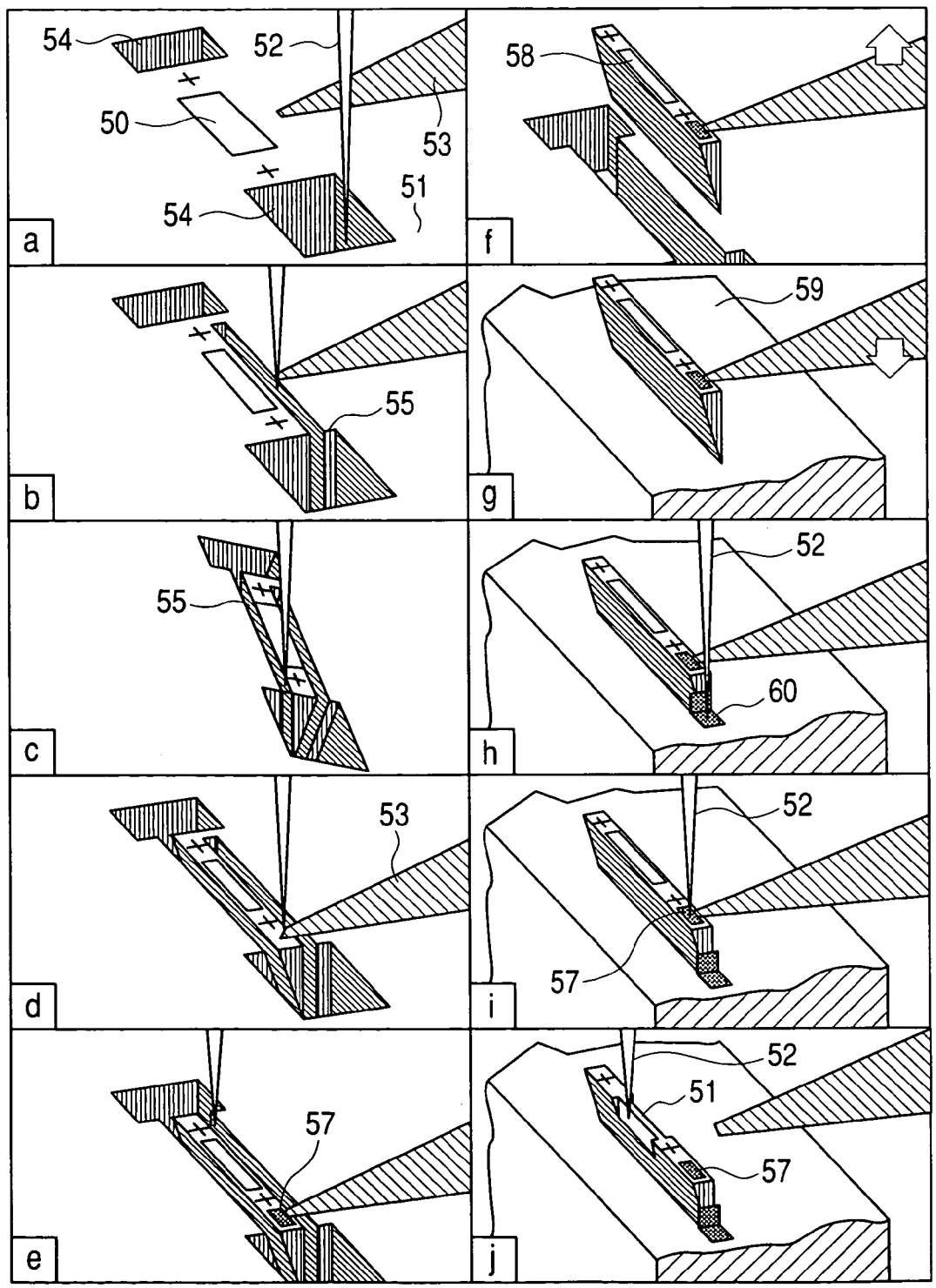
FIG. 23a part of a set of illustrations showing a sample fabrication method that uses the FIB apparatus, in accordance with an embodiment of the present invention.
FIG. 23b part of a set of illustrations showing a sample fabrication method that uses the FIB apparatus, in accordance with an embodiment of the present invention.
FIG. 23c part of a set of illustrations showing a sample fabrication method that uses the FIB apparatus, in accordance with an embodiment of the present invention.
FIG. 23d part of a set of illustrations showing a sample fabrication method that uses the FIB apparatus, in accordance with an embodiment of the present invention.
FIG. 23e part of a set of illustrations showing a sample fabrication method that uses the FIB apparatus, in accordance with an embodiment of the present invention.
FIG. 23f part of a set of illustrations showing a sample fabrication method that uses the FIB apparatus, in accordance with an embodiment of the present invention.
FIG. 23g part of a set of illustrations showing a sample fabrication method that uses the FIB apparatus, in accordance with an embodiment of the present invention.
FIG. 23h part of a set of illustrations showing a sample fabrication method that uses the FIB apparatus, in accordance with an embodiment of the present invention.
FIG. 23i part of a set of illustrations showing a sample fabrication method that uses the FIB apparatus, in accordance with an embodiment of the present invention.
FIG. 23j part of a set of illustrations showing a sample fabrication method that uses the FIB apparatus, in accordance with an embodiment of the present invention.

FIG. 23 shows one example of a method for preparing a sample using an FIB apparatus, in accordance with an embodiment of the present invention. In this technique, a substrate 51 is maintained at an attitude so that the ion beam 52 irradiates the surface of the sample substrate 51 at a right angle; the ion beam 52 is made to scan in the vicinity of an observation region 50 so as to draw a rectangle, whereby a square hole 54 of a necessary depth is formed in the sample surface (FIG. 23a). Next, a slot 55 is formed in the sample surface by scanning the ion beam 52 to draw a rectangle (FIG. 23b). Next, the substrate 51 is inclined so that the axis of the ion beam 52 forms a tilt angle of about 30° with a normal of the surface of the substrate 51 and a slant slot 56 is formed. A change in attitude of the substrate 51 for the tilt angle is done by the sample stage (FIG. 23c). A tip of the mechanical probe 53 is contacted to a part of the substrate 51 that will become a sample (FIG. 23d). A deposition film of a protective film 57 is formed by supplying a deposition gas from a deposition gas nozzle 20 and making the ion beam 52 irradiate locally a region that includes a tip part of the mechanical probe 53. A specimen 58 that is a separated portion of the substrate 51 and the tip of the mechanical probe 53 that are in a contact state are connected with a deposition film for probe fixing 57 (FIG. 23e). A remaining part is subjected to cut-off processing by the FIB, and the separated specimen 58 is cut off from the substrate 51. The separated specimen 58 thus cut off becomes a state of being supported by the mechanical probe 53 connected thereto (FIG. 23f). The separated specimen 58 is moved to a desired position, in this case, to a TEM (Transmission electron Microscope) holder 59 (FIG. 23g). A deposition film for sample fixing 60 is formed in a region that includes the separated specimen 58 and the TEM holder 59 (FIG. 23h). The observation region 50 in this separated specimen 58 is processed into a thin film of a thickness of approximately 100 nm using the ion beam 52 (FIG. 23i and FIG. 23j). The thin film 61 is observed with TEM by transmitting an electron beam there through.

Figure 24:
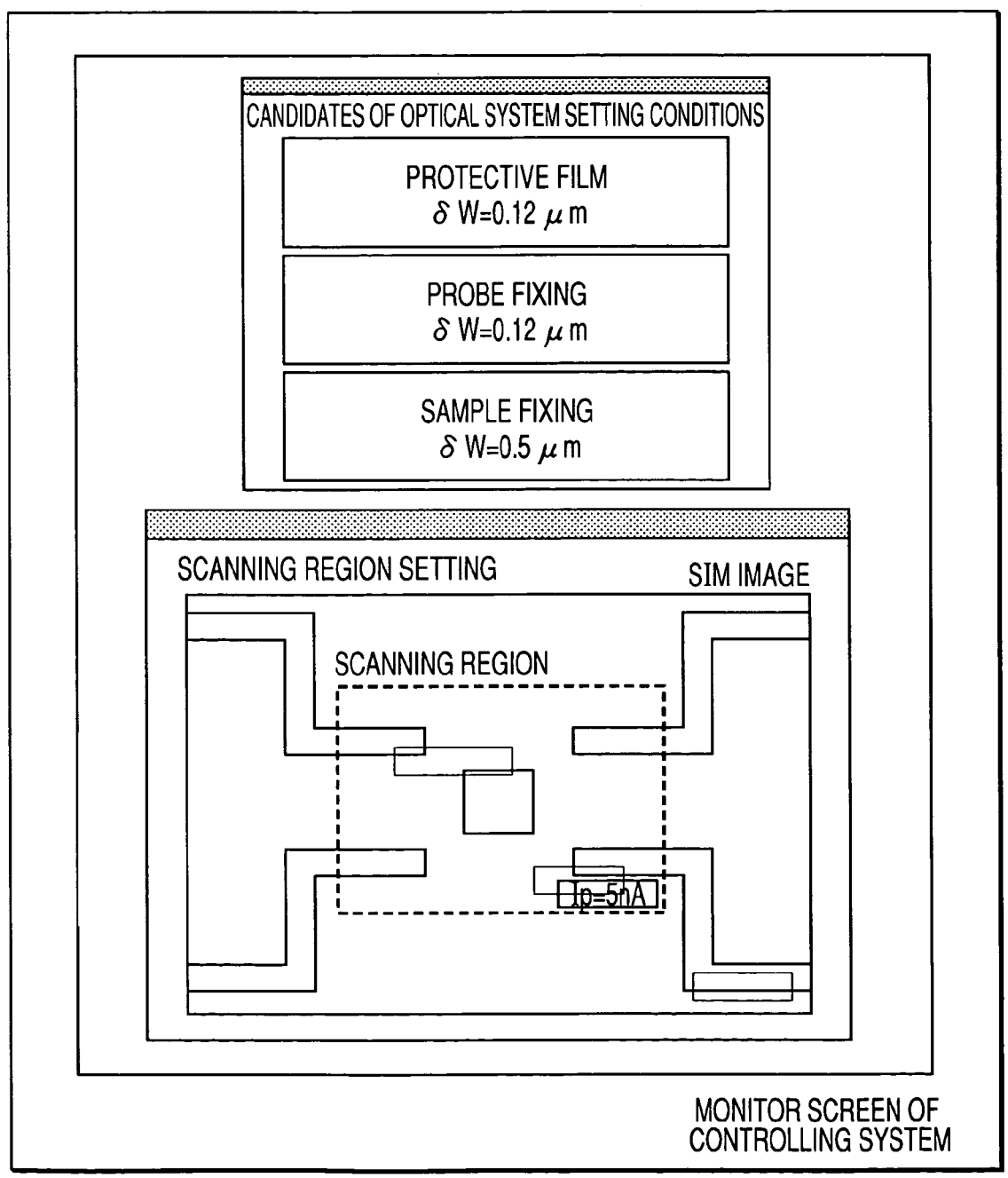
FIG. 24 is a view showing is one set of deposition monitor screen of control systems, in accordance with an embodiment of the present invention.

FIG. 24 is an example of one set of deposition monitor screen of control systems used in this embodiment. The operator selects a desired deposition process from the selection screen, and assigns the scanning region displayed on the setup screen for a deposition position. Furthermore, its registration screen is the registration screen in FIG. 13 with a scanning area newly added.

Fifth Embodiment

Figure 25:
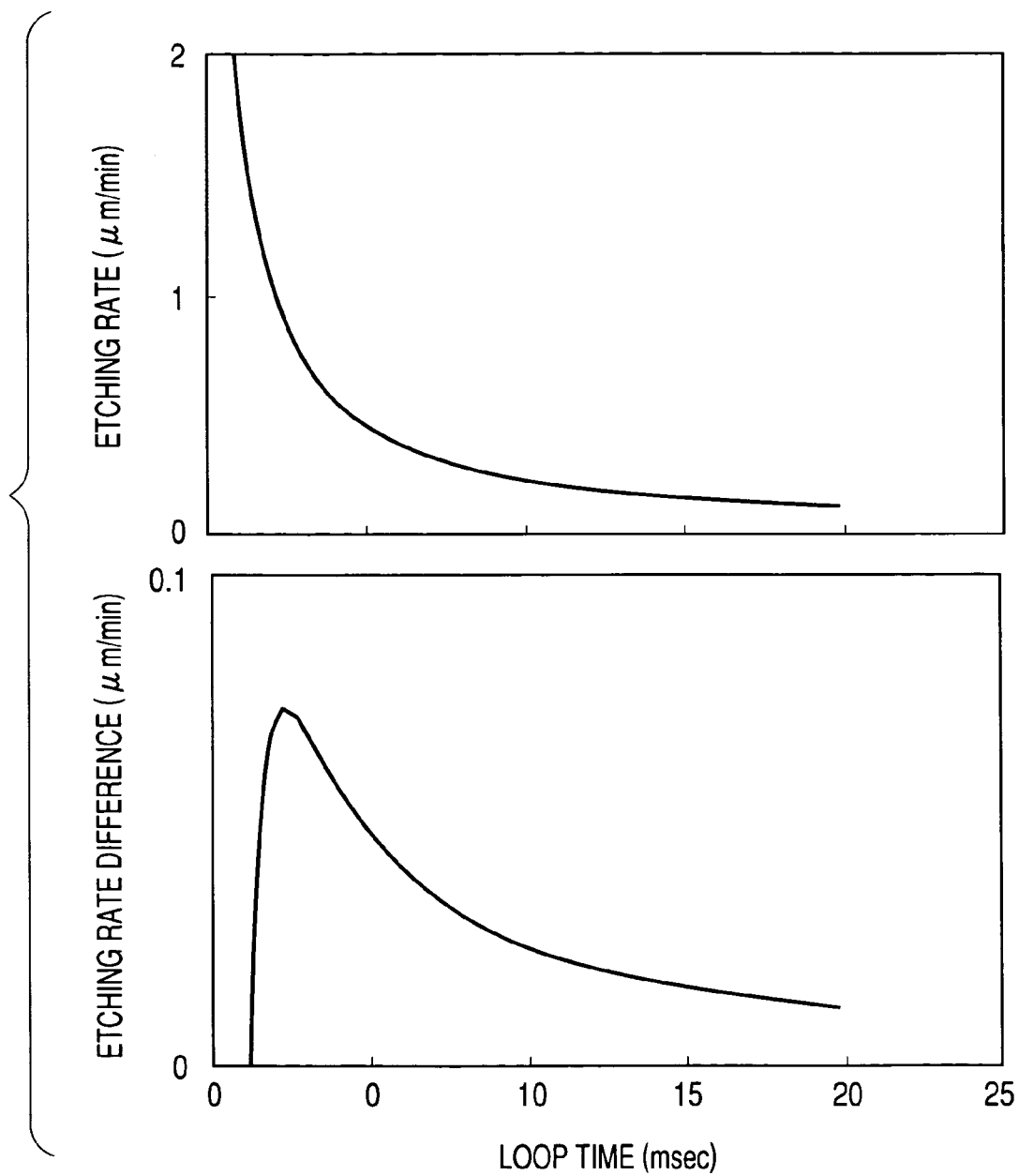
FIG. 25 is diagrams showing the loop time dependence of the etching rate and that of the etching rate difference, in accordance with an embodiment of the present invention.

FIG. 25 is the loop time dependence of the etching rate and that of the etching rate difference, in accordance with an embodiment of the present invention. The etching rate means an etching depth per unit time. The etching rate difference when the processed region is composed of multiple materials is a difference in etching rate between the said multiple materials. The probe size d and the optimal dwell time Td for the preset value of the beam current were also used for selective etching, just as the method for depositing a film, as the scan spacing and the dwell time. The etching rate decreases monotonously depending on the loop time, whereas the etching rate difference takes the maximum value at 3 ms. When the loop time is set to this value, the difference in etching between the said multiple materials can be enlarged substantially.

Figure 26:
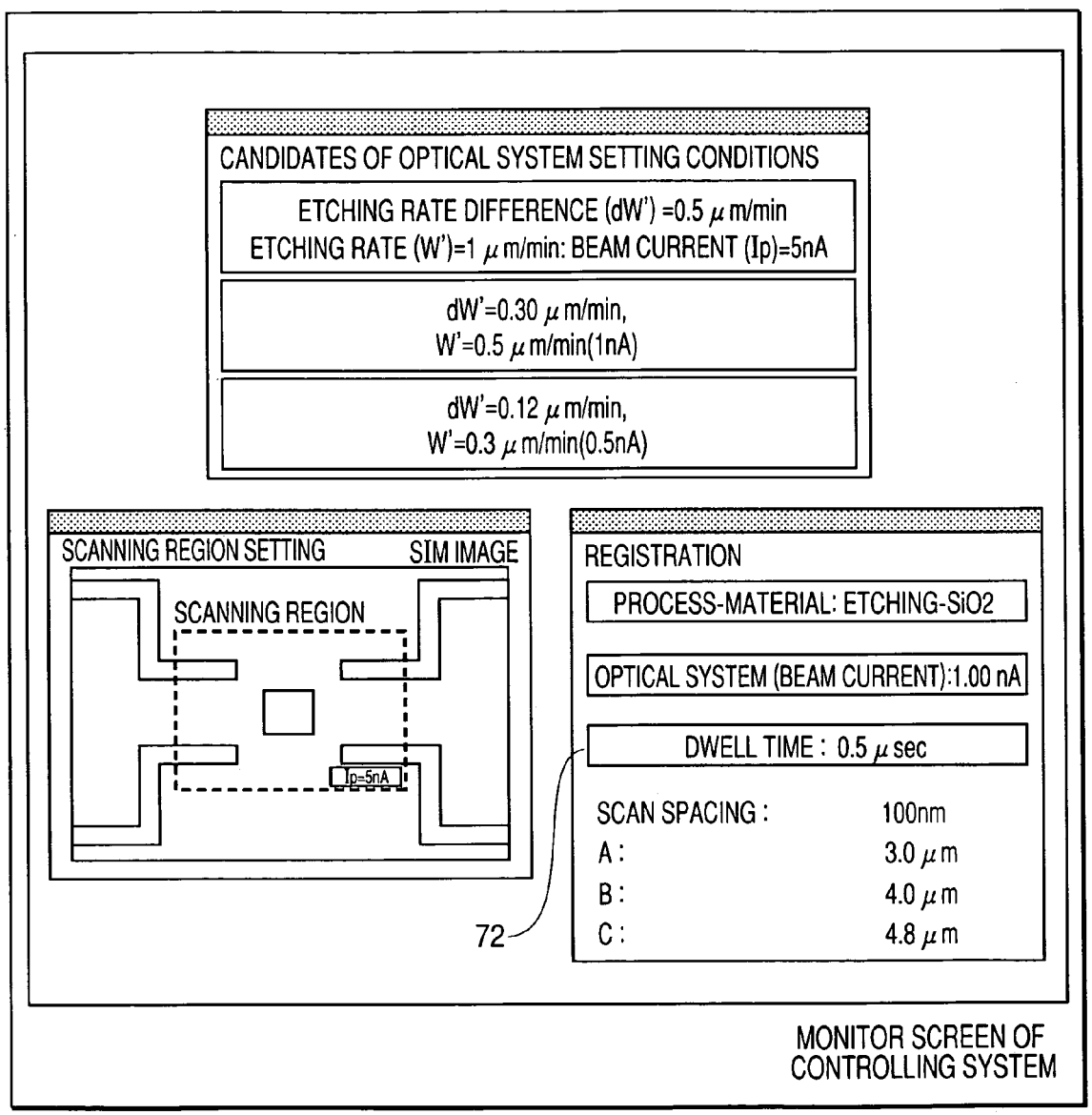
FIG. 26 is a view showing one set of selective etching monitor screen of control systems, in accordance with an embodiment of the present invention.

FIG. 26 is one set of selective etching monitor screen of control systems used in this embodiment. The operator sets the scanning region displayed on the setup screen as a selective etching position, selects an optical system setting indicating desired etching rate and etching rate difference from the selection screen. Moreover, two or more choices are added to the dwell time 72 on the registration screen in FIG. 13.

Figure 27:
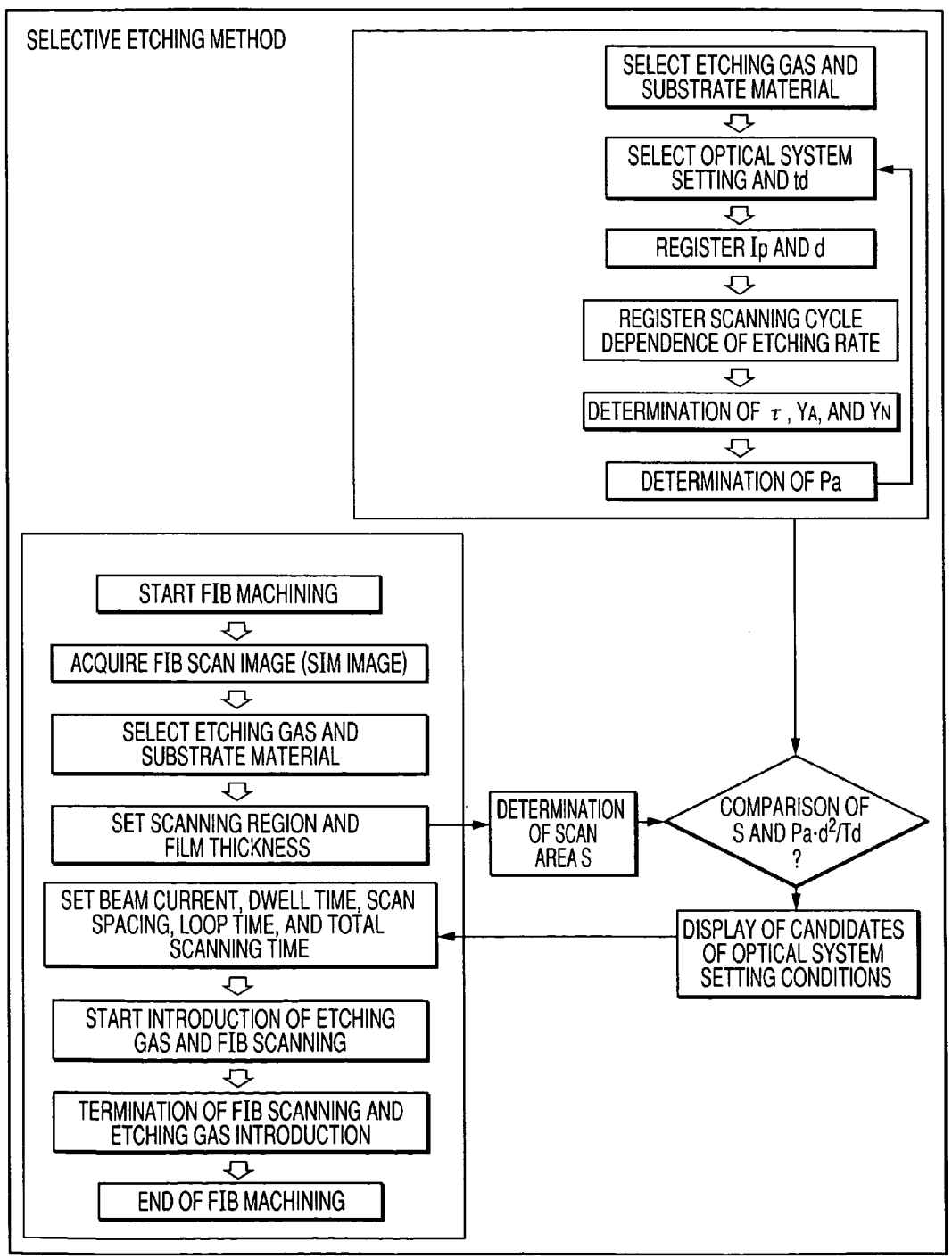
FIG. 27 is a flowchart showing the selective etching method, in accordance with an embodiment of the present invention.

FIG. 27 is a flowchart showing the selective etching method that is one of embodiments of this invention. As means for calibrating an etching rate, the loop time dependence of the etching rate is used. The etching rate (Y) mostly agrees with Equation 5:

$$Y = Y_A(1 - e^{-P/\tau}) + Y_n \quad (5)$$

Here, $Y_A$ denotes an assist coefficient, P the loop time, $\tau$ the relaxation time, and $Y_N$ the sputter coefficient. These variables are found from fitting Equation 5 to the measured values of the etching rate. Equation 5 is used for calculation of the etching rate and the etching rate difference.

With the use of the means for calibrating the etching rate shown in FIG. 26, the probe size d, the assist coefficient $Y_A$, the relaxation time $\tau$, and the sputter coefficient $Y_N$ are recorded for each optical system setting (beam current value) and the dwell time Td. Alternatively, a method in which the scanning area, the etching rate, etc., are stored in the form of a table for each optical system setting as substitutes for $Y_A$, $\tau$, $Y_N$, etc. may be used. In each optical system setting, the scan area S that realizes a desired etching rate is expressed by Equation 6:

$$S = \frac{Pa \cdot d^2}{Td} \quad (6)$$

Here, Pa denotes the loop time that produces a desired etching rate difference. The optical system setting that produces a desired etching rate difference is selected so as to satisfy the scanning area being set by the operator. Thereby, the beam current, the dwell time, and the scan spacing, which are set by the operator in the conventional method, can be set automatically. Incidentally, since the probe size 14 of the FIB 11 affects the etching rate, there is a case where auto-focusing is performed before selecting an optical system setting and starting film deposition.

Other Embodiments

The present invention provides a method for depositing a film on the surface of a sample by spraying a deposition gas on the surface of the sample and further scanning a focused charged particle beam with a charged-particle-beam irradiation optical system, the method comprising the steps of: estimating a deposition rate from information of the scan spacing dependence of the deposition rate; and performing the scanning while holding a scan spacing and a dwell time of the charged particle beam constant.

The present invention also provides a method for selectively etching a sample by spraying an etching gas on the sample surface and scanning a focused charged particle beam with a charged-particle-beam irradiation optical system, wherein an etching rate difference is estimated from information of the loop time dependence of the etching rate for constituent materials, and the scanning is performed while holding a scan spacing and a dwell time of the charged particle beam constant.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. Charged particle beam equipment comprising:
an optical system for charged particle beam irradiation, the optical system configured to scan focused charged particles on a sample in a predetermined loop time;
a display device configured to display a scan image of the optical system;
a control device configured to control the optical system;
a sample stage configured to mount the sample;
a spraying device configured to spray a deposition gas on the sample;
a storing device configured to store information of the loop time dependence of a film accumulation rate;
an estimating device configured to estimate a deposition rate from the dependence information and preset values of the optical system; and
a display device configured to display the deposition rate being estimated.

2. The charged particle beam equipment of claim 1, further comprising:
a setting up device configured to set up a scanning region of the charged particles; and
a selecting device configured to select an optical system setting on which the deposition rate becomes a maximum for the scanning region being set.

3. Charged particle beam equipment comprising:
a deposition apparatus configured to deposit a film by focusing charged particles, irradiating a sample with the charged particles, and spraying a deposition gas on the sample; and
a control unit configured to cause the deposition apparatus perform the steps of spraying the deposition gas on the sample surface, estimating a deposition rate from a loop time dependence of the deposition rate of the deposition gas, and scanning a charged particle beam on the sample while holding constant a scan spacing and a dwell time of the charged particle beam that is made to irradiate the sample.

4. The charged particle beam equipment of claim 3, wherein the control unit is further configured to cause the deposition apparatus to perform the steps of:
estimating the deposition rate for a scanning region being set from information of the loop time dependence of the deposition rate; and
controlling an irradiation optical system in the deposition apparatus so that a beam current and a probe size of the charged particle beam become desired values.

5. The charged particle beam equipment of claim 3, wherein the control unit is further configured to cause the deposition apparatus to perform the steps of:
storing a beam current, a probe size, and an optimal dwell time for each optical system setting;
storing the loop time dependence of the deposition rate for each optical system setting;
finding the deposition rate for an arbitrary scanning region;
selecting an optical system setting that maximizes the deposition rate; and
depositing a film using the scan spacing and the optimal dwell time associated with the optical system setting and the probe size both of which were selected.

6. Charged particle beam equipment comprising:
an optical system for charged particle beam irradiation, the optical system configured to scan focused charge particles on a sample in a predetermined loop time;

a display device configured to display a scan image of the sample by the charged particle beam;

a control device configured to control the optical system;

a sample stage configured to mount the sample;

a spraying device configured to spray an etching gas on the sample;

a storing device configured to store information of a loop time dependence of a processing volume fraction for multiple materials;

an estimating device configured to estimate an etching rate difference in the depth direction between constituent materials of the sample from the information and preset values of the optical system; and a displaying device configured to display the etching rate difference being estimated.

7. The charged particle beam equipment of claim 6, further comprising:

a setting up device configured to set up a scanning region of the charge particles; and a selecting device configured to select a setting of the optical system that produces a maximum beam current among settings of the optical system that produces a desired etching rate difference for the scanning region being set.

8. The charged particle beam equipment of claim 6, wherein the control device is further configured to cause a etching apparatus to perform the steps of:

storing a beam current, a probe size, and an optimal dwell time for each optical system setting;

storing the loop time dependence of the etching rate for each optical system setting;

finding the etching rate difference for an arbitrary scanning region;

selecting an optical system setting that produces a desired etching rate difference; and performing selective etching using a scan spacing and the optimal dwell time associated with the optical system setting and the probe size both of which were selected, whereby a desired difference in etching depth is obtained.

9. Charged particle beam equipment comprising:

an etching apparatus configured to etch a sample by focusing charged particles, irradiating the sample with the charged particles, and spraying an etching gas on the sample;

a control unit configured to control a charged particle etching apparatus; and an input device configured to specify a desired region to be etched, wherein the control unit causes the etching apparatus to perform the steps of spraying the etching gas on the sample surface, estimating an etching rate for a region being set by the input device from a loop time dependence of the etching rate of the etching gas, and scanning a charged particle beam on the sample while holding constant a scan spacing and a dwell time of the charged particle beam that is made to irradiate the sample.

* * * * *